United States Patent
Takemura et al.

(10) Patent No.: US 10,141,272 B2
(45) Date of Patent: *Nov. 27, 2018

(54) SEMICONDUCTOR APPARATUS, STACKED SEMICONDUCTOR APPARATUS AND ENCAPSULATED STACKED-SEMICONDUCTOR APPARATUS EACH HAVING PHOTO-CURABLE RESIN LAYER

(71) Applicant: SHIN-ETSU CHEMICAL CO., LTD., Tokyo (JP)

(72) Inventors: Katsuya Takemura, Jyoetsu (JP); Kyoko Soga, Annaka (JP); Satoshi Asai, Maebashi (JP); Kazunori Kondo, Takasaki (JP); Michihiro Sugo, Takasaki (JP); Hideto Kato, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/126,116

(22) PCT Filed: Mar. 16, 2015

(86) PCT No.: PCT/JP2015/001433
§ 371 (c)(1),
(2) Date: Sep. 14, 2016

(87) PCT Pub. No.: WO2015/151426
PCT Pub. Date: Oct. 8, 2015

(65) Prior Publication Data
US 2017/0077043 A1 Mar. 16, 2017

(30) Foreign Application Priority Data
Mar. 31, 2014 (JP) ................................. 2014-071301

(51) Int. Cl.
*H01L 23/00* (2006.01)
*C25D 7/00* (2006.01)
(Continued)

(52) U.S. Cl.
CPC ............ *H01L 23/562* (2013.01); *C23C 14/00* (2013.01); *C23C 14/042* (2013.01); *C23C 14/34* (2013.01);
(Continued)

(58) Field of Classification Search
CPC ............... H01L 23/562; H01L 23/5389; H01L 23/5384; H01L 23/5386; H01L 23/3114;
(Continued)

(56) References Cited

U.S. PATENT DOCUMENTS

2006/0225918 A1  10/2006  Chinda et al.
2007/0045746 A1  3/2007  Sunohara et al.
(Continued)

FOREIGN PATENT DOCUMENTS

CN  102903682 A  1/2013
EP  2551904 A1  1/2013
(Continued)

OTHER PUBLICATIONS

Oct. 13, 2016 International Preliminary Report on Patentability issued in PCT/JP2015/001433.
(Continued)

*Primary Examiner* — Michael Jung
(74) *Attorney, Agent, or Firm* — Oliff PLC

(57) ABSTRACT

A semiconductor apparatus including a semiconductor device, an on-semiconductor-device metal pad and a metal interconnect each electrically connected to the semiconductor device, a through electrode and a solder bump each electrically connected to the metal interconnect, a first insulating layer on which the semiconductor device is
(Continued)

placed, a second insulating layer formed on the semiconductor device, a third insulating layer formed on the second insulating layer, wherein the metal interconnect is electrically connected to the semiconductor device via the on-semiconductor-device metal pad at an upper surface of the second insulating layer, and the metal interconnect penetrates the second insulating layer from its upper surface and is electrically connected to the through electrode at an lower surface of the second insulating layer. This semiconductor apparatus can be easily placed on a circuit board and stacked, and can reduce its warpage even with dense metal interconnects.

7 Claims, 9 Drawing Sheets

(51) Int. Cl.
*H01L 23/12* (2006.01)
*H01L 23/52* (2006.01)
*H01L 25/10* (2006.01)
*H01L 25/03* (2006.01)
*H01L 23/538* (2006.01)
*C25D 7/12* (2006.01)
*C25D 5/02* (2006.01)
*C23C 14/00* (2006.01)
*C25D 5/50* (2006.01)
*C23C 14/04* (2006.01)
*C23C 14/34* (2006.01)
*G03F 7/00* (2006.01)
*G03F 7/075* (2006.01)
*H01L 21/48* (2006.01)
*H01L 23/31* (2006.01)
*H01L 25/065* (2006.01)
*H01L 25/00* (2006.01)
*H01L 21/56* (2006.01)
*H01L 23/498* (2006.01)
*H05K 1/18* (2006.01)

(52) U.S. Cl.
CPC ............ *C25D 5/022* (2013.01); *C25D 5/505* (2013.01); *C25D 7/00* (2013.01); *C25D 7/123* (2013.01); *G03F 7/0035* (2013.01); *G03F 7/0757* (2013.01); *H01L 21/486* (2013.01); *H01L 21/4853* (2013.01); *H01L 21/565* (2013.01); *H01L 23/12* (2013.01); *H01L 23/3114* (2013.01); *H01L 23/49827* (2013.01); *H01L 23/52* (2013.01); *H01L 23/5384* (2013.01); *H01L 23/5386* (2013.01); *H01L 23/5389* (2013.01); *H01L 24/13* (2013.01); *H01L 24/24* (2013.01); *H01L 24/82* (2013.01); *H01L 24/97* (2013.01); *H01L 25/03* (2013.01); *H01L 25/0657* (2013.01); *H01L 25/105* (2013.01); *H01L 25/50* (2013.01); *H01L 21/568* (2013.01); *H01L 23/49816* (2013.01); *H01L 24/16* (2013.01); *H01L 24/32* (2013.01); *H01L 24/73* (2013.01); *H01L 24/83* (2013.01); *H01L 24/92* (2013.01); *H01L 2224/0401* (2013.01); *H01L 2224/04105* (2013.01); *H01L 2224/12105* (2013.01); *H01L 2224/13025* (2013.01); *H01L 2224/13111* (2013.01); *H01L 2224/16145* (2013.01); *H01L 2224/16225* (2013.01); *H01L 2224/19* (2013.01); *H01L 2224/24226* (2013.01); *H01L 2224/32145* (2013.01); *H01L 2224/32225* (2013.01); *H01L 2224/73204* (2013.01); *H01L 2224/73267* (2013.01); *H01L 2224/8203* (2013.01); *H01L 2224/82005* (2013.01); *H01L 2224/92125* (2013.01); *H01L 2224/92244* (2013.01); *H01L 2224/97* (2013.01); *H01L 2225/06513* (2013.01); *H01L 2225/06548* (2013.01); *H01L 2225/06555* (2013.01); *H01L 2225/06582* (2013.01); *H01L 2225/1035* (2013.01); *H01L 2225/1058* (2013.01); *H01L 2924/3511* (2013.01); *H05K 1/185* (2013.01); *H05K 2201/10515* (2013.01)

(58) Field of Classification Search
CPC ... H01L 24/13; H01L 25/0657; G03F 7/0035; G03F 7/0757; C23C 14/34; C23C 14/032; C25D 7/123; C25D 5/022
See application file for complete search history.

(56) References Cited

U.S. PATENT DOCUMENTS

| | | | |
|---|---|---|---|
| 2008/0246126 A1 | 10/2008 | Bowles et al. | |
| 2010/0244242 A1 | 9/2010 | Komatsu et al. | |
| 2011/0143092 A1 | 6/2011 | Asai et al. | |
| 2011/0298110 A1 | 12/2011 | Pagaila et al. | |
| 2013/0026650 A1 | 1/2013 | Yamagata et al. | |
| 2013/0075926 A1 | 3/2013 | Bae et al. | |
| 2013/0127037 A1 | 5/2013 | Mori et al. | |
| 2013/0223658 A1 | 8/2013 | Betlehem et al. | |
| 2013/0249075 A1 | 9/2013 | Tateiwa et al. | |
| 2014/0367160 A1* | 12/2014 | Yu .......................... H01L 21/568 174/377 |
| 2015/0035146 A1* | 2/2015 | Lin .......................... H01L 24/19 257/738 |
| 2015/0102502 A1* | 4/2015 | Chiu ........................ H01L 21/561 257/774 |
| 2015/0108661 A1* | 4/2015 | Vincent ................... H01L 24/30 257/777 |
| 2015/0348904 A1* | 12/2015 | Huang .............. H01L 21/76802 257/774 |
| 2015/0348916 A1* | 12/2015 | Chen .................. H01L 21/4803 257/669 |
| 2016/0233166 A1* | 8/2016 | Teh ........................ H01L 24/19 |

FOREIGN PATENT DOCUMENTS

| | | |
|---|---|---|
| EP | 2 602 661 A1 | 6/2013 |
| JP | 2006-295114 A | 10/2006 |
| JP | 2007-067016 A | 3/2007 |
| JP | 2010-245509 A | 10/2010 |
| JP | 2013-030593 A | 2/2013 |
| JP | 2013-197382 A | 9/2013 |
| TW | 2011/37523 A | 11/2011 |
| TW | 201312713 A | 3/2013 |
| WO | 2011-122228 A1 | 10/2011 |

OTHER PUBLICATIONS

May 26, 2015 International Search Report issued in International Patent Application No. PCT/JP2015/001433.
Nov. 14, 2017 Extended European Search Report issued in European Patent Application No. 15772875.9.
May 16, 2018 Office Action issued in Taiwanese Application No. 104110257.
Jul. 20, 2018 Search Report issued in Chinese Application No. 201580018117.5.

* cited by examiner

SEMICONDUCTOR APPARATUS, STACKED SEMICONDUCTOR APPARATUS AND ENCAPSULATED STACKED-SEMICONDUCTOR APPARATUS EACH HAVING PHOTO-CURABLE RESIN LAYER

TECHNICAL FIELD

The present invention relates to a semiconductor apparatus, a stacked semiconductor apparatus, an encapsulated stacked-semiconductor apparatus, and methods for manufacturing these.

BACKGROUND ART

As various electronic devices including a personal computer, a digital camera, and a mobile phone progress toward downsizing and higher performance, requirements are rapidly increasing for further downsizing, thinning, and higher density in a semiconductor device. Accordingly, it is desired to develop a photosensitive insulating material, a stacked semiconductor apparatus, and a method for manufacturing the same that can cope with an increase in surface area of a substrate for the sake of higher productivity, and can be used in high density mounting technologies including a chip size package or a chip scale package (CSP) and a three-dimensional lamination.

Conventionally, examples of a method for manufacturing a semiconductor apparatus by connecting an electrode formed on a semiconductor device to an interconnect pattern formed on a substrate includes connection between the semiconductor device and the substrate by wire bonding. However, the connection between the semiconductor device and the substrate by wire bonding requires a space for drawing metal wire on the semiconductor device. This makes the apparatus large, resulting in difficulty downsizing.

On the other hand, Patent Documents 1 and 2 disclose examples of placing a semiconductor device on a circuit board and methods for placing three-dimensionally stacked semiconductor devices on a circuit board without wire bonding.

Patent Document 1 discloses an example of the method for manufacturing a semiconductor apparatus having a semiconductor device, such as light-emitting device and light-receiving device. In this example, as shown in FIG. 25, a semiconductor apparatus 50 is manufactured by connecting an aluminum (Al) electrode pad 55 to a redistribution pattern 52 via a through electrode 56 and connecting the redistribution pattern 52 to a redistribution pattern 57 on a circuit board 53 via a solder bump 58. A device-forming layer 59 and multiple Al electrode pads 55 are formed on the upper surface of the semiconductor apparatus. A through hole 54 penetrating the semiconductor apparatus is provided between the Al electrode pad 55 and the redistribution pattern 52 by dry etching. The through electrode 56 is formed within the through hole 54 by plating with copper. The device-forming layer 59 is placed on the upper surface of the semiconductor apparatus to emit or receive light.

This method does not require the connection between the semiconductor device 51 and the circuit board 53 by wire bonding, but requires rewiring on the semiconductor apparatus and placing the solder bump. Thus, fine rewiring and highly dense solder bump are required with downsizing of the semiconductor apparatus, resulting in difficulty in practice.

Patent Document 2 discloses a method for manufacturing a semiconductor apparatus useful for three-dimensional stacking of multiple semiconductor devices and also discloses an exemplary structure in which a semiconductor device 180 and a semiconductor device 280 are stacked, as shown in FIG. 26.

Each semiconductor device (180, 280) to be stacked is connected to a substrate (110, 210) including a core material (150, 250), a through electrode (140, 240), and an interconnect layer (157, 257) via a solder bump (170, 270) and a pad (182, 282) of the semiconductor device. The interconnect layer (157, 257) includes a mounting pad (165, 265), a connecting pad (164, 264), and an interconnect (266). A space between the outermost surface of the substrate (110, 210) and the semiconductor device (180, 280) is filled with an under fill (184, 284). Patent Document 2 discloses a method for connecting and stacking, via solder bumps (174, 176), such substrates each connected to the semiconductor device.

However, Patent Document 2, in which the semiconductor device is connected to the circuit board via a solder bump, also considerably requires highly dense solder bumps with downsizing of the semiconductor device as in Patent Document 1, resulting in difficulty in practice. In addition, the through electrode provided in the second substrate 210 is difficult to be formed because this formation requires complicated steps.

Patent Document 3 discloses examples of a semiconductor apparatus placed on a circuit board, a method for manufacturing the same, a semiconductor apparatus including stacked semiconductor devices, and a method for manufacturing the same. Patent Document 3 discloses a semiconductor apparatus, as shown in FIG. 27, including an organic substrate 301, through vias 304 which penetrate the organic substrate 301 in its thickness direction, external electrodes 305b and internal electrodes 305a provided on both faces of the organic substrate 301 and electrically connected to the through vias 304, a semiconductor device 302 mounted on one main surface of the organic substrate 301 via a bonding layer 303, with a device circuit surface thereof facing upward, an insulating material layer 306 for encapsulating the semiconductor device 302 and a periphery thereof, a metal thin film wiring layer 307 provided in the insulating material layer 306, with a part of this metal thin film wiring layer being exposed on an external surface, metal vies 310 electrically connected to the metal thin film wiring layer 307, a wiring protective film 311, and external electrodes 309 formed on the metal thin film wiring layer 307, in which the metal thin film wiring layer 307 is structured such that the electrodes disposed on the device circuit surface of the semiconductor device 302, the internal electrodes 305a, the metal vies 310, and the external electrodes 309 formed on the metal thin film wiring layer 307 are electrically connected. Patent Document 3 also discloses methods for manufacturing this semiconductor apparatus placed on a circuit board and a semiconductor apparatus including multiple semiconductor devices that are stacked. The method of Patent Document 3 does not require to form many solder bumps on the semiconductor device, and thus can form many electrodes on the semiconductor device with high density, thereby achieving downsizing of the semiconductor apparatus.

However, a structure of the semiconductor apparatus disclosed in Patent Document 3 still has difficulty in processing to form the through vias 304 toward the circuit board. Although processing with a micro-hole drill and processing with laser are disclosed therein, these processing techniques are still unsatisfactory for miniaturization of the semiconductor apparatus to be expected.

In addition, Patent Document 3 discloses, as shown in FIG. 28, patterning a photosensitive resin layer 316 applied on the surface of the semiconductor device to form openings 317 for vias 308 to be formed on the semiconductor device 302. The insulating material layer 306 on the periphery of the semiconductor device is formed by, for example, spin coating. In practice, however, this method requires complicated steps of providing the resin twice for coating the semiconductor device 302 with the photosensitive resin layer 316 and for forming the insulating material layer 306 on the periphery of the semiconductor device 302. Moreover, when spin coating is carried out to provide the insulating material layer 306, a height of a semiconductor device 302 is important. In case that the height exceeds several tens of μm, it is practically difficult to get over the semiconductor device and then provide the insulating material layer 306 by spin coating without voids. This publication also discloses an example in which the vias 308 of the photosensitive resin layer 316 and the metal vias 310 of the insulating material layer 306 are separately formed by different steps, and an example in which the metal vias 310 are processed with laser, but these steps are complicated and not rational. The publication also discloses that the photosensitive resin layer 316 and the insulating material layer 306 can be simultaneously provided on the periphery of the semiconductor device 302 and on the circuit surface, but fails to disclose illustrative examples of this method. It is difficult to provide these resin layers without generating voids on the periphery of the semiconductor device. Furthermore, the publication also discloses that the vias 308 of the photosensitive resin layer 316 and the metal vias 310 of the insulating material layer 306 can be simultaneously formed, but fails to disclose illustrative examples of this method.

CITATION LIST

Patent Literature

Patent Document 1: Japanese Unexamined Patent publication (Kokai) No. 2007-67016
Patent Document 2: Japanese Unexamined Patent publication (Kokai) No. 2010-245509
Patent Document 3: Japanese Unexamined Patent publication (Kokai) No. 2013-30593

SUMMARY OF INVENTION

Technical Problem

The present invention was accomplished in view of the above circumstances, and has an object to provide a semiconductor apparatus that can be easily placed on a circuit board and stacked and can reduce its warpage even with dense metal interconnects.

Another object is to provide a method for manufacturing a semiconductor apparatus that facilitates processing openings of an electrode pad portion, a through electrode, and the like when the semiconductor apparatus is manufactured.

Further object is to provide a stacked semiconductor apparatus including such semiconductor apparatuses that are stacked, an encapsulated stacked-semiconductor apparatus obtained by placing the stacked semiconductor apparatus on a circuit board and encapsulating it, and methods for manufacturing these.

Solution to Problem

To achieve the objects, the present invention provides a semiconductor apparatus comprising: a semiconductor device; an on-semiconductor-device metal pad electrically connected to the semiconductor device; a metal interconnect electrically connected to the semiconductor device; a through electrode electrically connected to the metal interconnect; a solder bump electrically connected to the metal interconnect; a first insulating layer on which the semiconductor device is placed; a second insulating layer formed on the semiconductor device; a third insulating layer formed on the second insulating layer, wherein
the metal interconnect is electrically connected to the semiconductor device via the on-semiconductor-device metal pad at an upper surface of the second insulating layer, and the metal interconnect penetrates the second insulating layer from the upper surface of the second insulating layer and is electrically connected to the through electrode at an lower surface of the second insulating layer.

Such a semiconductor apparatus can be easily placed on a circuit board and stacked by forming the fine electrode on the semiconductor device and providing the through electrode outside the semiconductor device. In addition, this semiconductor apparatus, in which the metal interconnect is formed on both surfaces of the second insulating layer, can reduce its warpage even with dense metal interconnects.

It is preferred that the first insulating layer be formed by a photo-curable dry film or a photo-curable resist coating film, the second insulating layer be formed by the photo-curable dry film, and the third insulating layer be formed by the photo-curable dry film or a photo-curable resist coating film.

Such a semiconductor apparatus allows the semiconductor device to be embedded without voids at the periphery, even when the semiconductor device has a height of several tens of μm.

Additionally, it is preferred that the semiconductor device have a height of 20 to 100 μm, the first insulating film have a thickness of 1 to 20 μm, the second insulating film have a thickness of 5 to 100 μm, the third insulating film have a thickness of 5 to 100 μm, and the semiconductor apparatus have a thickness of 50 to 300 μm.

Such a semiconductor apparatus is thin and allows the semiconductor device to be embedded without voids at the periphery.

The photo-curable dry film preferably has a photo-curable resin layer composed of a chemically amplified negative resist composition containing:
(A) a silicone skeleton-containing polymer compound having a repeating unit shown by the following general formula
(1) and having a weight average molecular weight of 3,000 to 500,000

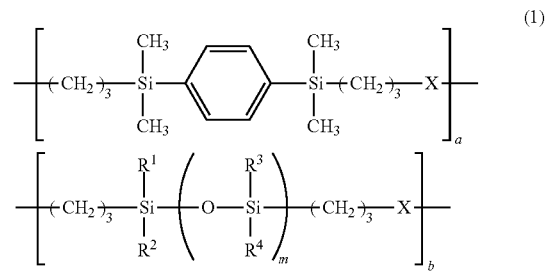

-continued

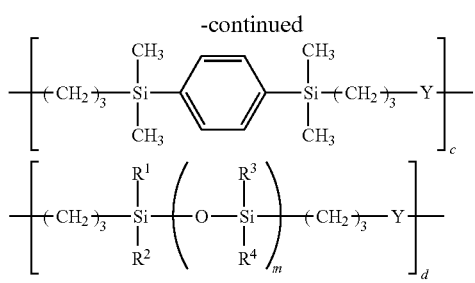

wherein R¹ to R⁴ may be the same or different and represent a monovalent hydrocarbon group having 1 to 8 carbon atoms; "m" is an integer of 1 to 100; "a", "b", "o", and "d" are each 0 or a positive number, and "a", "b", "c", and "d" are not simultaneously 0, provided that a+b+c+d=1; X represents an organic group shown by the following general formula (2); and Y represents an organic group shown by the following general formula (3);

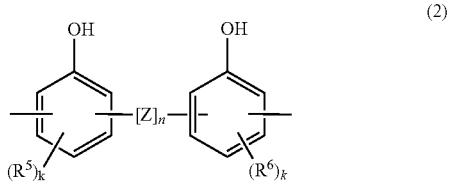

wherein Z represents a divalent organic group selected from any of

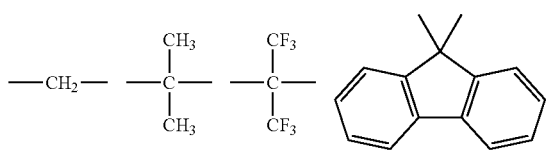

"n" is 0 or 1; R⁵ and R⁶ each represent an alkyl group or alkoxy group having 1 to 4 carbon atoms and may be the same or different from each other; and "k" is 0, 1, or 2;

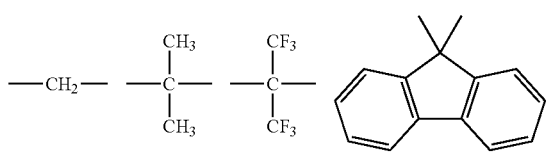

wherein V represents a divalent organic group selected from any of

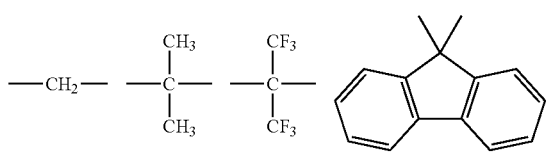

"p" is 0 or 1; R⁷ and R⁸ each represent an alkyl group or alkoxy group having 1 to 4 carbon atoms and may be the same or different from each other; and "h" is 0, 1, or 2;

(B) one or more crosslinking agents selected from an amino condensate modified with formaldehyde or formaldehyde-alcohol and a phenol compound having on average two or more methylol groups or alkoxymethylol groups per molecule;

(C) a photo acid generator capable of generating an acid by decomposition with light having a wavelength of 190 to 500 nm; and (D) a solvent.

Such a semiconductor apparatus is further prevented from warping.

Furthermore, the present invention provides a stacked semiconductor apparatus, comprising a plurality of the above semiconductor apparatuses stacked by flip chip.

The inventive semiconductor apparatus can be easily stacked, and thus is suitable for such a stacked semiconductor apparatus.

Furthermore, the present invention provides an encapsulated stacked-semiconductor apparatus, comprising the above stacked semiconductor apparatus placed on a substrate having an electric circuit, the stacked semiconductor apparatus being encapsulated with an insulating encapsulating resin layer.

The inventive semiconductor apparatus can be easily placed on a circuit board and stacked, and thus is suitable for such an encapsulated stacked-semiconductor apparatus.

Furthermore, the present invention provides a method for manufacturing a semiconductor apparatus, comprising the steps of:

(1) applying a temporary adhesive to a supporting substrate and forming a first insulating layer having a thickness of 1 to 20 μm on the temporary adhesive, wherein the first insulating layer consists of a photo-curable resin layer composed of a resist composition;

(2) patterning the first insulating layer by lithography via a mask to form a hole pattern for forming a through electrode, and then baking the first insulating layer to cure the first insulating layer;

(3) forming a seed layer on the first insluting layer by sputtering, and then filling the hole pattern for forming the through electrode by plating to form a metal interconnect to be connected to the through electrode;

(4) die bonding a semiconductor device having a height of 20 to 100 μm to the cured first insulating layer with a die bonding agent, wherein an exposed electrode pad is provided on an upper surface of the semiconductor device;

(5) preparing photo-curable dry films comprising a photo-curable resin layer sandwiched between a supporting film and a protective film, wherein the photo-curable resin layer has a thickness of 5 to 100 μm and is composed of a resist composition;

(6) forming a second insulating layer by laminating the photo-curable resin layer of one of the photo-curable dry film such that the semiconductor device die-bonded on the first insulating layer is covered with the photo-curable resin layer;

(7) patterning the second insulating layer by lithography via a mask to simultaneously form an opening on the electrode pad, an opening for forming a metal interconnect that penetrates the second insulating layer on the metal interconnect to be connected to the through electrode, and an opening for forming the through electrode, and then baking the second insulating layer to cure the second insulating layer;
(8) after curing, forming a seed layer by sputtering, then filling the opening on the electrode pad, the opening for forming the metal interconnect that penetrates the second insulating layer, and the opening for forming the through electrode by plating to respectively form an on-semiconductor-device metal pad, the metal interconnect that penetrates the second insulating layer, and the through electrode, and connecting the on-semiconductor-device metal pad and the metal interconnect that penetrates the second insulating layer, which are formed by plating, via a metal interconnect formed by plating;
(9) after forming the metal interconnects, forming a third insulating layer by laminating the photo-curable resin layer of the other photo-curable dry film or applying the same resist composition as used in the photo-curable dry film by spin coating;
(10) patterning the third insulating layer by lithography via a mask to form an opening on the through electrode, and then baking the third insulating layer to cure the third insulating layer; and
(11) after curing, forming a solder bump in the opening on the through electrode.

Such a method for manufacturing a semiconductor apparatus facilitates placing the semiconductor apparatus on a circuit board and stacking the semiconductor apparatuses by forming the fine electrode on the semiconductor device and forming the through electrode outside the semiconductor device. This method also facilitates processing the openings of the electrode pad portion, the through electrode, and the like. In addition, use of the photo-curable dry film allows the semiconductor apparatus to be filled without voids on the periphery of the semiconductor device, even when the semiconductor device has a height of several tens of μm. Furthermore, formation of the metal interconnects on both surfaces of the second insulating layer enables reduction in warpage of the semiconductor apparatus even with dense metal interconnects.

The resist composition constituting the photo-curable resin layer of the photo-curable dry film prepared in the step (5) is preferably a chemically amplified negative resist composition containing:
(A) a silicone skeleton-containing polymer compound having a repeating unit shown by the following general formula
(1) and having a weight average molecular weight of 3,000 to 500,000

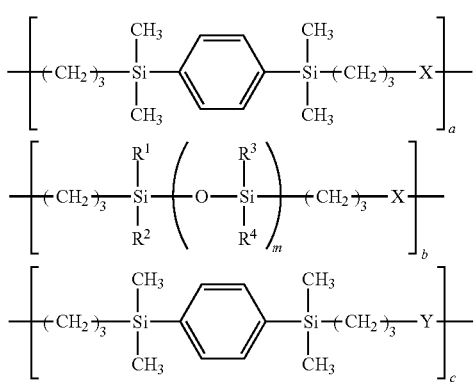

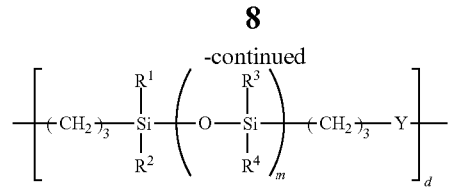

wherein $R^1$ to $R^4$ may be the same or different and represent a monovalent hydrocarbon group having 1 to 8 carbon atoms; "m" is an integer of 1 to 100; "a", "b", "c", and "d" are each 0 or a positive number, and "a", "b", "c", and "d" are not simultaneously 0, provided that a+b+c+d=1; X represents an organic group shown by the following general formula (2); and Y represents an organic group shown by the following general formula (3);

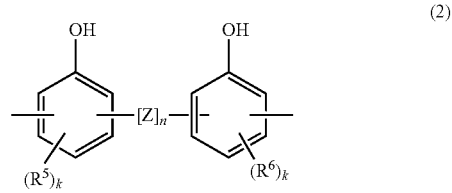

wherein Z represents a divalent organic group selected from any of

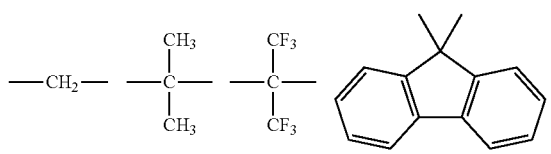

"n" is 0 or 1; $R^5$ and $R^6$ each represent an alkyl group or alkoxy group having 1 to 4 carbon atoms and may be the same or different from each other; and "k" is 0, 1, or 2;

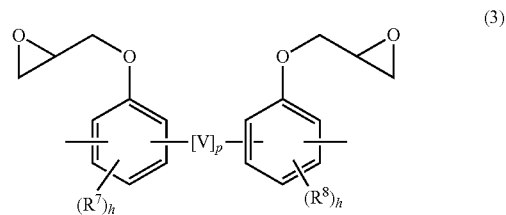

wherein V represents a divalent organic group selected from any of

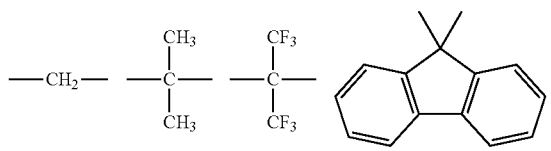

"p" is 0 or 1; $R^7$ and $R^8$ each represent an alkyl group or alkoxy group having 1 to 4 carbon atoms and may be the same or different from each other; and "h" is 0, 1, or 2;
(B) one or more crosslinking agents selected from an amino condensate modified with formaldehyde or formaldehyde-alcohol and a phenol compound having on average two or more methylol groups or alkoxymethylol groups per molecule;
(C) a photo acid generator capable of generating an acid by decomposition with light having a wavelength of 190 to 500 nm; and
(D) a solvent.

Such a composition can reduce warpage of the semiconductor apparatus, which is expected to occur when the semiconductor apparatus is diced into individual pieces, and thus facilitates stacking the individual semiconductor apparatuses and placing it on a circuit board.

The step (6) preferably includes mechanically pressing the second insulating layer.

This allows the second insulating layer on the semiconductor device to have thin and uniform thickness, enabling the second insulating layer to be flatten.

The step (11) may include
forming an on-through-electrode metal pad in the opening on the through electrode by plating, and
forming a solder ball on the on-through-electrode metal pad for the solder bump. In this manner, the solder bump can be formed in the opening on the through electrode.

Alternatively, plating to form the through electrode in the step (8) may include plating with SnAg,
the step (10) may include patterning to form the opening on the through electrode such that the SnAg plating is uncovered, and
the step (11) may include melting the SnAg plating and thereby forming a protruding electrode in the opening on the through electrode for the solder bump. In this manner, the solder bump can be formed in the opening on the through electrode more easily and rationally.

The method may further comprise the steps of:
after the step (11), removing the supporting substrate, which has been temporarily bonded to the first insulating layer in the step (1); and
after removing the substrate, dicing the semiconductor apparatus into individual pieces. In this manner, individual semiconductor apparatuses can be manufactured.

A stacked semiconductor apparatus can be manufactured by stacking a plurality of individual semiconductor apparatuses obtained by dicing in the above manufacturing method, while putting an insulting resin layer between the individual semiconductor apparatuses such that the individual semiconductor apparatuses are electrically connected through the solder bump.

Furthermore, an encapsulated stacked-semiconductor apparatus can be manufactured by a method comprising the steps of:
placing a stacked semiconductor apparatus manufactured by the above manufacturing method on a substrate having an electric circuit; and
encapsulating the stacked semiconductor apparatus placed on the substrate with an insulating encapsulating resin layer.

Advantageous Effects of Invention

The inventive semiconductor apparatus and method of manufacturing the same yield the following effects.

Specifically, the photo-curable dry film, which includes a photo-curable resin layer having a thickness of 5 to 100 µm and composed of a resist composition, is used to fill the periphery of the semiconductor device placed on the first insulating layer formed on the supporting substrate, whereby the periphery of the semiconductor device can be easily filled without voids by the photo-curable dry film even when the semiconductor device has a height of several tens of µm.

After the periphery of the semiconductor device placed on the first insulating layer formed on the supporting substrate is laminated with the photo-curable dry film having the photo-curable resin layer composed of the resist composition, the photo-curable resin layer (the second insulating layer) on the semiconductor device may be mechanically pressed. This enables the film thickness to be adjusted and reduced. Thus, mechanically pressing enables the photo-curable resin layer laminated on the periphery of the semiconductor device to have uniform thickness and to be flatten.

Patterning of the laminated photo-curable dry film (the second insulating layer) by lithography via a mask enables collective and simultaneous formation of an opening on the electrode pad on the semiconductor device, an opening for forming a metal interconnect that penetrates the second insulating layer, and an opening for forming a through electrode.

A through metal via (TMV), which serves as an electrode when structures having semiconductor devices are stacked in three-dimension or placed on a circuit board, can be easily formed by a known and general lithography technique with a mask.

In one embodiment, the method includes: filling the opening on the electrode pad on the semiconductor device, the opening for forming the metal interconnect that penetrates the second insulating layer, and the opening for forming the through electrode by plating to respectively form an on-semiconductor-device metal pad, the metal interconnect that penetrates the second insulating layer, and the through electrode; connecting the on-semiconductor-device metal pad and the metal interconnect that penetrates the second insulating layer via a metal interconnect formed by plating; laminating this metal interconnect with another photo-curable dry film; patterning the film to form an opening on the through electrode (TMV) disposed outside the semiconductor device; forming an on-through-electrode metal pad in this opening on the through electrode; forming a solder ball thereon; and dicing the semiconductor apparatus into individual pieces after removing the supporting substrate. This method can easily manufacture a semiconductor apparatus.

In another embodiment is provided a method including the steps of plating with SnAg when the through electrode (TMV) is formed by plating, laminating another photo-curable dry film, patterning the film to form the opening on the through electrode such that the SnAg plating is uncovered, baking and thereby curing the film after patterning, melting and protruding the SnAg plating toward the opening on the through electrode. This method can manufacture a semiconductor apparatus more easily and rationally.

The supporting substrate and the first insulating layer formed on the supporting substrate are bonded with a temporary adhesive, and thus the supporting substrate can be easily removed. After the supporting substrate is removed, the semiconductor apparatus may be diced into individual pieces. In this manner, individual semiconductor apparatuses can be easily and rationally manufactured.

The individual semiconductor apparatus obtained by the above manufacturing method has the protruding solder bump, such as the solder ball or the protruding SnAg, on the upper portion and the through electrode, which can be easily uncovered by removing the substrate, on the lower portion. Thus, a plurality of the individual semiconductor apparatuses can be electrically connected and stacked by using the protruding solder bump and the uncovered electrode easily and very rationally.

While a conventional single-side interconnect pattern, in which metal interconnects are formed on only the on-semiconductor-device metal pad side, tends to increase warpage of the semiconductor apparatus with an increase in interconnect density, the inventive semiconductor apparatus, in which metal interconnects are formed both sides of the second insulating layer, is prevented from warping regardless of the increase in interconnect density. Moreover, a multilevel interconnect is required in future to cope with an increase of signals in the semiconductor apparatus, so that it is important to extremely reduce warpage of the semiconductor apparatus itself. The inventive semiconductor apparatus, in which metal interconnects are formed both sides of the second insulating layer and warpage is extremely reduced, is therefore also suited to the multilevel interconnect.

Moreover, when a chemically amplified negative resist composition is used for the photo-curable resin layer in the present invention, warpage of the semiconductor apparatus, which is expected to occur when the semiconductor apparatus is diced into individual pieces, can be further reduced. Thus, such a semiconductor apparatus can be suitably stacked and placed on a circuit board.

As previously described, the inventive semiconductor apparatus can be easily placed on a circuit board and stacked by forming the fine electrode on the semiconductor device and providing the through electrode outside the semiconductor device. In addition, this semiconductor apparatus allows the semiconductor device to be embedded without voids at the periphery even when the semiconductor device has a height of several tens of μm, and warpage of the semiconductor apparatus can be reduced even with dense metal interconnects.

Moreover, the inventive method for manufacturing a semiconductor apparatus facilitates placing the semiconductor apparatus on a circuit board and stacking the semiconductor apparatuses by forming the fine electrode on the semiconductor device and forming the through electrode outside the semiconductor device. This method also facilitates processing the openings of the electrode pad portion, the through electrode, and the like.

Moreover, the inventive semiconductor apparatus thus obtained can be easily placed on a circuit board and stacked, and thus can be used for a stacked semiconductor apparatus including the semiconductor apparatuses that are stacked and for an encapsulated stacked-semiconductor apparatus including the stacked semiconductor apparatus placed on a circuit board and then encapsulated.

DESCRIPTION OF EMBODIMENTS

Figure 1:
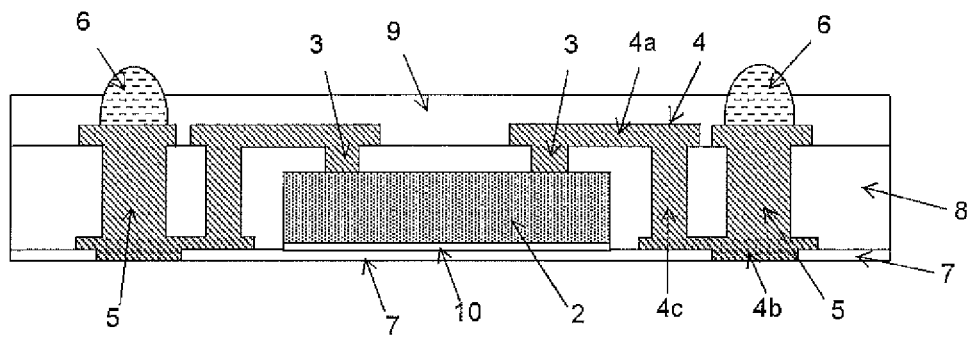
FIG. 1 is a schematic sectional view showing a semiconductor apparatus according to an embodiment of the present invention.

As previously described, requirements are rapidly increasing for further downsizing, thinning, and higher density in a semiconductor apparatus, and it is desired to develop a semiconductor apparatus and a method for manufacturing the same that can be easily placed on a circuit board and stacked. Moreover, as a multilevel interconnect is required in future to cope with an increase of signals in the semiconductor apparatus, it is desired to develop a semiconductor apparatus and a method for manufacturing the same that can reduce warpage of the semiconductor apparatus itself even with dense metal interconnects, such as a multilevel interconnect.

The present inventors have earnestly investigated to achieve the above object and consequently found that a semiconductor apparatus and stacked semiconductor apparatus that solve the problems can be easily manufactured by the following steps, thereby bringing the present invention to completion.

First, a first insulating layer is formed on a supporting substrate to which a temporary adhesive is applied, with a resist composition. The first insulating layer is then patterned to form a hole pattern for forming a through electrode. After curing by baking, the hole pattern for forming the through electrode is filled by plating to form a metal interconnect to be connected to the through electrode, and a semiconductor device is die bonded to the first insulating layer. Then, the periphery of the die-bonded semiconductor device is laminated with a photo-curable dry film having a photo-curable resin layer composed of a resist composition, whereby the periphery of the semiconductor device can be filled with the film without voids (a second insulating layer is formed). The second insulating layer is then patterned by lithography via a mask. This patterning enables simultaneous formation of an opening on the electrode pad, an opening for forming a metal interconnect that penetrates the second insulating layer, and an opening for forming the through electrode, thus enabling easy processing. From these findings, the present invention was brought to completion.

After the second insulating layer is cured by baking, the opening on the electrode pad, the opening for forming the metal interconnect that penetrates the second insulating layer, and the opening for forming the through electrode are filled by plating to form an on-semiconductor-device metal pad, the metal interconnect that penetrates the second insulating layer, and the through electrode. The on-semiconductor-device metal pad and the metal interconnect that penetrates the second insulating layer, which are formed by plating, are connected via a metal interconnect formed by plating. Then, a third insulating layer is formed thereon, and the third insulating layer is patterned to form an opening on the through electrode. After curing the third insulating layer, a solder bump is formed in this opening. Furthermore, the supporting substrate bonded with the temporary adhesive may be removed, and the semiconductor apparatus may be diced into individual pieces. This method can manufacture a semiconductor apparatus much rationally and achieve the object of the present invention.

Moreover, the inventors found that the semiconductor apparatus manufactured by the above method, in which metal interconnects are formed on both sides of the second insulating layer, can reduce warpage of the semiconductor apparatus itself even with dense interconnects.

Furthermore, the semiconductor apparatus obtained by the above manufacturing method has the protruding solder bump on the upper portion and the through electrode, which can be easily uncovered by removing the supporting substrate, on the lower portion. Thus, a plurality of the semiconductor apparatuses can be easily electrically connected and stacked by using the protruding solder bump and the uncovered electrode. This stacked semiconductor apparatus can be easily placed on a circuit board. From these findings, the present invention was brought to completion.

That is, the present invention is a semiconductor apparatus including: a semiconductor device; an on-semiconductor-device metal pad electrically connected to the semiconductor device; a metal interconnect electrically connected to the semiconductor device; a through electrode electrically connected to the metal interconnect; a solder bump electrically connected to the metal interconnect; a first insulating layer on which the semiconductor device is placed; a second insulating layer formed on the semiconductor device; a third insulating layer formed on the second insulating layer, wherein the metal interconnect is electrically connected to the semiconductor device via the on-semiconductor-device metal pad at an upper surface of the second insulating layer, and the metal interconnect penetrates the second insulating layer from the upper surface of the second insulating layer and is electrically connected to the through electrode at an lower surface of the second insulating layer.

Hereinafter, the present invention will be described with reference to drawings in detail, but the present invention is not limited thereto.

As shown in FIG. 1, the inventive semiconductor apparatus 1 includes a semiconductor device 2, an on-semiconductor-device metal pad 3 and a metal interconnect 4 each electrically connected to the semiconductor device 2, a through electrode 5 and a solder bump 6 each electrically connected to the metal interconnect 4, a first insulating layer 7 on which the semiconductor device 2 is placed, a second insulating layer 8 formed on the semiconductor device 2, a third insulating layer 9 formed on the second insulating layer 8. The metal interconnect 4 is electrically connected to the semiconductor device 2 via the on-semiconductor-device metal pad 3 at an upper surface of the second insulating layer 8, penetrates the second insulating layer 8 from the upper surface of the second insulating layer 8, and is electrically connected to the through electrode 5 at an lower surface of the second insulating layer 8.

The metal interconnect 4 is composed of a metal interconnect (an upper metal interconnect) 4a connected to the on-semiconductor-device metal pad 3 at the upper surface of the second insulating layer 8, a metal interconnect (a lower metal interconnect) 4b connected to the through electrode 5 at the lower surface of the second insulating layer 8, and a metal interconnect (a through metal interconnect) 4c that penetrates the second insulating layer 8 and connects the upper metal interconnect 4a and the lower metal interconnect 4b.

In the semiconductor apparatus 1 of FIG. 1, the semiconductor device 2 is die bonded to the first insulating layer 7 with a die bonding agent 10.

Such a semiconductor apparatus can be easily placed on a circuit board and stacked by forming the fine electrode on the semiconductor device and providing the through electrode outside the semiconductor device. In addition, this semiconductor apparatus, in which the metal interconnect is formed on both surfaces of the second insulating layer, can reduce its warpage even with dense metal interconnects.

It is preferred that the first insulating layer 7 be formed by a photo-curable dry film or a photo-curable resist coating film, the second insulating layer 8 be formed by the photo-curable dry film, and the third insulating layer 9 be formed by the photo-curable dry film or a photo-curable resist coating film. Such a semiconductor apparatus allows the semiconductor device to be embedded without voids at the periphery even when the semiconductor device 2 has a height of several tens of μm.

Additionally, it is preferred that the semiconductor device 2 have a height of 20 to 100 μm, the first insulating film 7 have a thickness of 1 to 20 μm, the second insulating film 8 have a thickness of 5 to 100 μm, the third insulating film 9 have a thickness of 5 to 100 μm, and the semiconductor apparatus 1 have a thickness of 50 to 300 μm. Such a semiconductor apparatus is thin and allows the semiconductor device to be embedded without voids at the periphery.

The photo-curable dry film to be used for forming the first insulating layer 7, the second insulating layer 8, and the third insulating layer 9 preferably has a photo-curable resin layer composed of a chemically amplified negative resist composition containing the following components (A) to (D), for such a photo-curable dry film prevents warpage, reduces residual stress, and improves reliability and processing properties.

Of course, any other photo-curable resin may be used.

The component (A) is a silicone skeleton-containing polymer compound having a repeating unit shown by the following general formula (1) and having a weight average molecular weight of 3,000 to 500,000

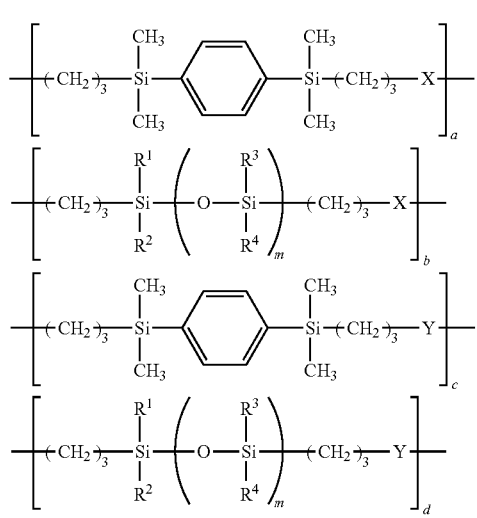

wherein $R^1$ to $R^4$ may be the same or different and represent a monovalent hydrocarbon group having 1 to 8 carbon atoms; "m" is an integer of 1 to 100; "a", "b", "c", and "d" are each 0 or a positive number, and "a", "b", "c", and "d" are not simultaneously 0, provided that a+b+c+d=1; X represents an organic group shown by the following general formula (2); and Y represents an organic group shown by the following general formula (3);

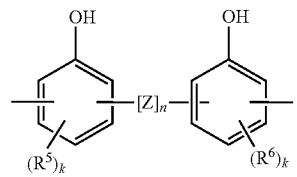

wherein Z represents a divalent organic group selected from any of

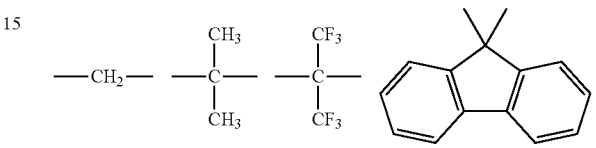

"n" is 0 or 1; $R^5$ and $R^6$ each represent an alkyl group or alkoxy group having 1 to 4 carbon atoms and may be the same or different from each other; and "k" is 0, 1, or 2;

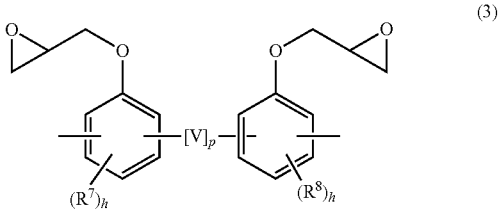

wherein V represents a divalent organic group selected from any of

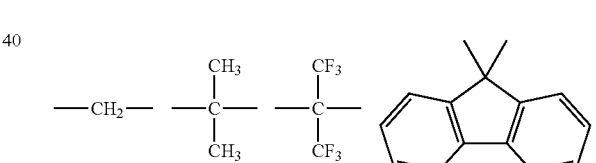

"p" is 0 or 1; $R^7$ and $R^8$ each represent an alkyl group or alkoxy group having 1 to 4 carbon atoms and may be the same or different from each other; and "h" is 0, 1, or 2.

The component (B) is one or more crosslinking agents selected from an amino condensate modified with formaldehyde or formaldehyde-alcohol and a phenol compound having on average two or more methylol groups or alkoxymethylol groups per molecule.

The component (C) is a photo acid generator capable of generating an acid by decomposition with light having a wavelength of 190 to 500 nm.

The component (D) is a solvent.

The component (B) may be any known crosslinking agent that is one or more compounds selected from an amino condensate modified with formaldehyde or formaldehyde-alcohol and a phenol compound having on average two or more methylol groups or alkoxymethylol groups per molecule.

Examples of the amino condensate modified with formaldehyde or formaldehyde-alcohol include melamine condensates modified with formaldehyde or formaldehyde-alcohol and urea condensates modified with formaldehyde or formaldehyde-alcohol.

These modified melamine condensates and modified urea condensates may be used alone or in combination of two or more kinds.

Examples of the phenol compound having on average two or more methylol groups or alkoxymethylol groups per molecule include (2-hydroxy-5-methyl)-1,3-benzenedimethanol, 2,2',6,6'-tetramethoxymethyl bisphenol A.

These phenol compounds may be used alone or in combination of two or more kinds.

The component (C) may be any compound capable of generating an acid by exposure to light having a wavelength of 190 to 500 nm, which serves as a curing catalyst.

Examples of such a photo acid generator include onium salts, diazomethane derivatives, glyoxime derivatives, β-ketosulfone derivatives, disulfone derivatives, nitrobenzylsulfonate derivatives, sulfonate ester derivatives, imide-yl-sulfonate derivatives, oximesulfonate derivatives, iminosulfonate derivatives, and triazine derivatives.

The component (D) may be any solvent capable of dissolving (A) the silicone skeleton-containing polymer compound, (B) the crosslinking agents, and (C) the photo acid generator.

Examples of the solvent include ketones such as cyclohexanone, cyclopentanone, and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone.

The first insulating layer 7 and the third insulating layer 9 may be a photo-curable resist coating film formed by applying the chemically amplified negative resist composition containing the components (A) to (D) by spin coating or, of course, may be a photo-curable resist coating film formed by applying other photo-curable resin by spin coating.

Furthermore, the present invention provides a stacked semiconductor apparatus including a plurality of the semiconductor apparatuses that are stacked by flip chip.

Figure 2:
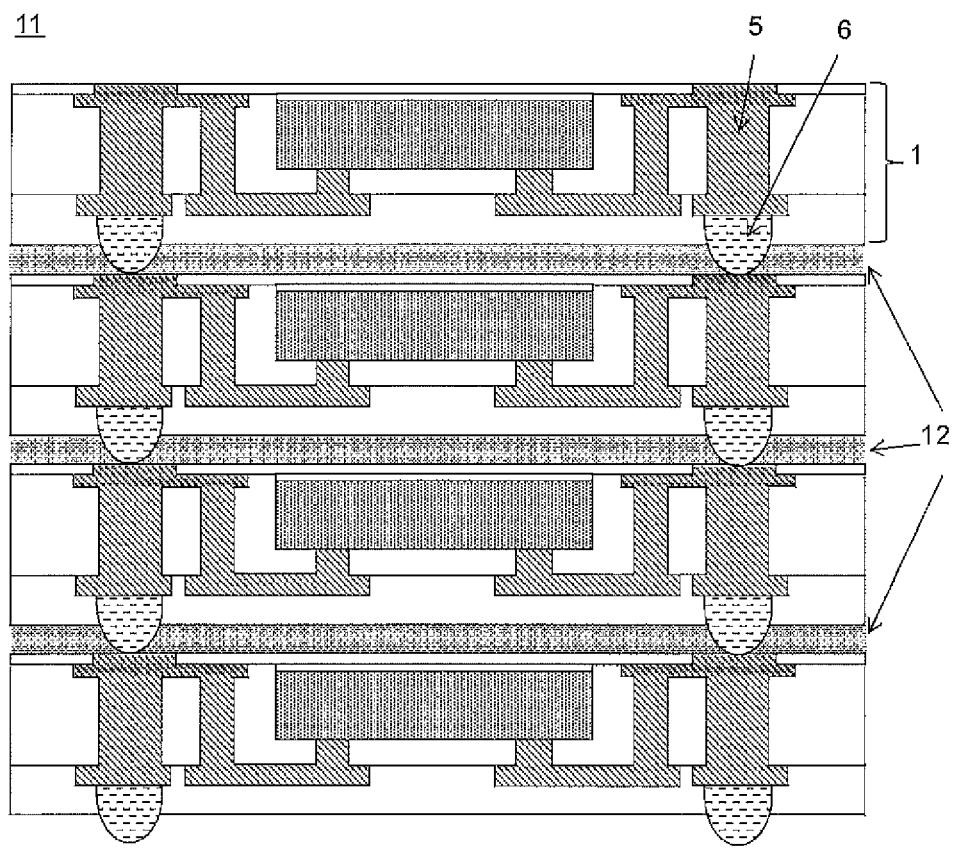
FIG. 2 is a schematic sectional view showing a stacked semiconductor apparatus according to an embodiment of the present invention.

The inventive stacked semiconductor apparatus 11 includes, as shown in FIG. 2, a plurality of the semiconductor apparatuses 1 electrically connected through the through electrodes 5 and the solder bumps 6 and stacked by flip chip, and may further include insulating resin layers 12 inserted between the semiconductor apparatuses.

Furthermore, the present invention provides an encapsulated stacked-semiconductor apparatus that includes the stacked semiconductor apparatus placed on a substrate having an electric circuit and encapsulated with an insulating encapsulating resin layer.

Figure 3:
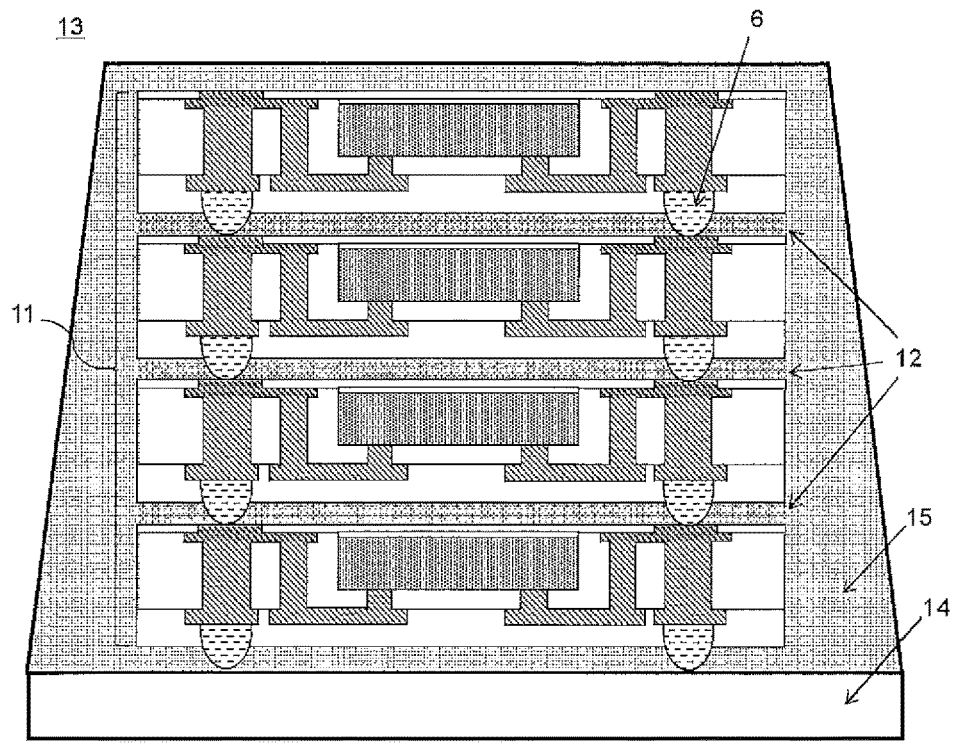
FIG. 3 is a schematic sectional view showing an encapsulated stacked-semiconductor apparatus according to an embodiment of the present invention.

The inventive encapsulated stacked-semiconductor apparatus 13 includes, as shown in FIG. 3, the stacked semiconductor apparatus 11 that is placed, through the solder bump 6, on a substrate (a circuit board 14) having an electric circuit, and encapsulated with an insulating encapsulating resin layer 15.

The above-described semiconductor apparatus can be manufactured by the inventive method for manufacturing a semiconductor apparatus shown below. The inventive method for manufacturing a semiconductor apparatus includes the steps of:

(1) applying a temporary adhesive to a supporting substrate and forming a first insulating layer having a thickness of 1 to 20 μm on the temporary adhesive, wherein the first insulating layer consists of a photo-curable resin layer composed of a resist composition;

(2) patterning the first insulating layer by lithography via a mask to form a hole pattern for forming a through electrode, and then baking the first insulating layer to cure the first insulating layer;

(3) forming a seed layer on the first insulting layer by sputtering, and then filling the hole pattern for forming the through electrode by plating to form a metal interconnect to be connected to the through electrode;

(4) die bonding a semiconductor device having a height of 20 to 100 μm to the cured first insulating layer with a die bonding agent, wherein an exposed electrode pad is provided on an upper surface of the semiconductor device;

(5) preparing photo-curable dry films comprising a photo-curable resin layer sandwiched between a supporting film and a protective film, wherein the photo-curable resin layer has a thickness of 5 to 100 μm and is composed of a resist composition;

(6) forming a second insulating layer by laminating the photo-curable resin layer of one of the photo-curable dry film such that the semiconductor device die-bonded on the first insulating layer is covered with the photo-curable resin layer;

(7) patterning the second insulating layer by lithography via a mask to simultaneously form an opening on the electrode pad, an opening for forming a metal interconnect that penetrates the second insulating layer on the metal interconnect to be connected to the through electrode, and an opening for forming the through electrode, and then baking the second insulating layer to cure the second insulating layer;

(8) after curing, forming a seed layer by sputtering, then filling the opening on the electrode pad, the opening for forming the metal interconnect that penetrates the second insulating layer, and the opening for forming the through electrode by plating to respectively form an on-semiconductor-device metal pad, the metal interconnect that penetrates the second insulating layer, and the through electrode, and connecting the on-semiconductor-device metal pad and the metal interconnect that penetrates the second insulating layer, which are formed by plating, via a metal interconnect formed by plating;

(9) after forming the metal interconnects, forming a third insulating layer by laminating the photo-curable resin layer of the other photo-curable dry film or applying the same resist composition as used in the photo-curable dry film by spin coating;

(10) patterning the third insulating layer by lithography via a mask to form an opening on the through electrode, and then baking the third insulating layer to cure the third insulating layer; and

(11) after curing, forming a solder bump in the opening on the through electrode.

In the following, each step will be described in detail.

Figure 4:
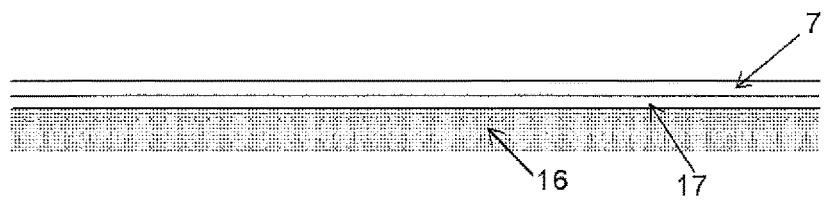
FIG. 4 is a schematic sectional view showing the step (1) in a method for manufacturing a semiconductor apparatus according to an embodiment of the present invention.

In the step (1), as shown in FIG. 4, a temporary adhesive 17 is first applied to a supporting substrate 16, and a first insulating layer 7, which consists of a photo-curable resin layer composed of a resist composition, having a thickness of 1 to 20 μm is formed on the temporary adhesive 17.

The supporting substrate 16 is not particularly limited and, for example, a silicon wafer or a glass substrate may be used.

The temporary adhesive 17 may be for example, but is not particularly limited to, a thermoplastic resin, including an olefin type thermoplastic elastomer, a polybutadiene type thermoplastic elastomer, a styrene type thermoplastic elastomer, a styrene/butadiene type thermoplastic elastomer, and a styrene/polyolefin type thermoplastic elastomer. In particular, a hydrogenated polystyrene type elastomer excellent in heat resistance is preferable. Illustrative examples thereof include Tuftec (available from Asahi Kasei Chemicals Corporation), ESPOLEX SB series (available from Sumitomo Chemical Co., Ltd.), RABALON (available from Mitsubishi Chemical Corporation), SEPTON (available from Kuraray Co., Ltd.), DYNARON (available from SSR). In addition, there may be mentioned a cycloolefin polymer represented by ZEONEX (available from ZEON Corporation) and a cyclic olefin copolymer represented by TOPAS (available from Nippon Polyplastics Co., Ltd.). A silicone type thermoplastic resin may also be used. For examples, dimethyl silicone, phenyl silicone, alkyl-modified silicone, or silicone resin is preferably used. Illustrative examples thereof include KF96, KF54, and X-40-9800 (all available from Shin-Etsu Chemical Co., Ltd.).

As described above, the first insulating layer 7 may be formed by, for example, laminating a photo-curable dry film having a photo-curable resin layer composed of a chemically amplified negative resist composition containing the components (A) to (D), or applying the resist composition by spin coating. Of course, other photo-curable resin may be used.

The first insulating layer has a thickness of 1 to 20 μm, preferably 5 to 10 μm. This thickness allows a thin semiconductor apparatus to be manufactured.

Figure 5:
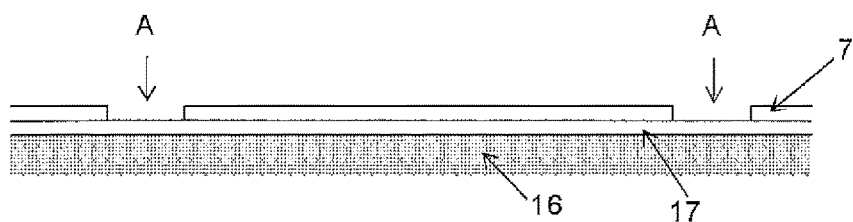
FIG. 5 is a schematic sectional view showing the step (2) in a method for manufacturing a semiconductor apparatus according to an embodiment of the present invention.

Then, in the step (2), the first insulating layer 7 is patterned by lithography via a mask to form a hole pattern A for forming a through electrode, as shown in FIG. 5. The first insulating layer 7 is then cured by baking.

In this patterning, after the first insulating layer 7 is formed, the layer is exposed to light, subjected to post exposure baking (PEB), developed, and optionally post-cured to form a pattern. In other words, a known lithography technique can be used for patterning.

To effectively carry out photo-curing reaction of the first insulating layer, to improve adhesion between the first insulating layer 7 and the supporting substrate 16, or to improve planarity of the adhering first insulating layer 7, pre-baking may be performed, if necessary. The pre-baking may be performed, for example, at 40 to 140° C. for 1 minute to 1 hour.

The layer is exposed to light having a wavelength of 190 to 500 nm via a photomask, and then cured. The photomask may be obtained by engraving a prescribed pattern. The photomask is preferably made of a material that can block the light having a wavelength of 190 to 500 nm. For example, a material such as chromium is preferably used, but it is not limited thereto.

Examples of the light having a wavelength of 190 to 500 nm include light having various wavelengths generated from, for example, a radiation-generating apparatus, including ultraviolet rays such as g-line and i-line and far ultraviolet rays (248 nm and 193 nm). The wavelength preferably ranges from 248 to 436 nm. The exposure dose preferably ranges from 10 to 3,000 mJ/cm$^2$. Such exposure causes an exposed part to crosslink, thereby forming a pattern that is insoluble in a developer.

Further, PEB is performed to enhance the development sensitivity. The PEB is preferably performed at 40 to 140° C. for 0.5 to 10 minutes.

The layer is then developed with a developer. Preferable examples of the developer include organic solvents such as isopropyl alcohol (IPA) and propylene glycol monomethyl ether acetate (PGMEA). Preferable examples of an alkali aqueous solution used for the developer include a 2.38% tetramethyl ammonium hydroxide (TMAH) aqueous solution. In the inventive method for manufacturing a semiconductor apparatus, an organic solvent is preferably used as the developer.

The development can be carried out by a usual method, for example, by soaking the substrate having a formed pattern into a developer. Then, if necessary, washing, rinsing, drying, and so forth may be performed to obtain a film of the photo-curable resin layer (the first insulating layer) having an intended pattern.

The first insulating layer, in which the pattern is thus formed, is baked with an oven or a hot plate preferably at 100 to 250° C., more preferably 150 to 220° C., much more preferably 170 to 190° C. to cure the layer (post-curing). When the post-curing temperature ranges from 100 to 250° C., the crosslinking density of the first insulating layer increases, and remaining volatile components can be removed. Thus, this temperature range is preferable in view of adhesiveness to a substrate, heat resistance, strength, and electronic characteristics. The time for post-curing can range from 10 minutes to 10 hours.

Figure 6:
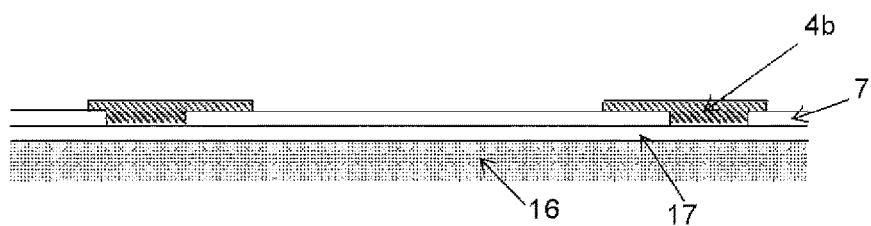
FIG. 6 is a schematic sectional view showing the step (3) in a method for manufacturing a semiconductor apparatus according to an embodiment of the present invention.

Then, in the step (3), a seed layer is formed on the first insulting layer 7 by sputtering, and the hole pattern A for forming the through electrode is filled by plating to form a metal interconnect (a lower metal interconnect) 4b to be connected to the through electrode, as shown in FIG. 6.

The plating is performed as follows, for example. A seed layer is formed on the first insulating layer 7 by sputtering, and the plating resist is patterned. The hole pattern A for forming the through electrode is then filled by plating with metal, such as electrolytic plating, to form the lower metal interconnect 4b. After the metal interconnect is formed, the seed layer is removed by etching to uncover the first insulating layer 7.

The lower metal interconnect 4b is appropriately adjusted so as to have a desired interconnect width. In particular, the lower metal interconnect is preferably formed with a thickness of 0.1 to 10 μm on the first insulating layer.

Figure 7:
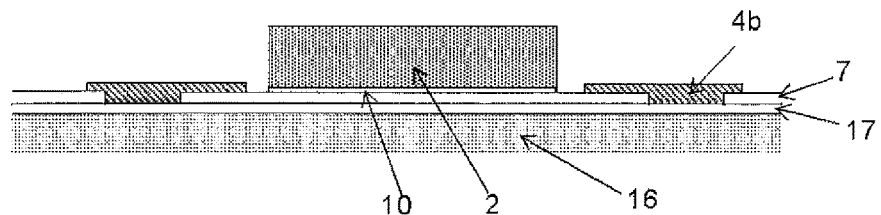
FIG. 7 is a schematic sectional view showing the step (4) in a method for manufacturing a semiconductor apparatus according to an embodiment of the present invention.

Then, in the step (4), as shown in FIG. 7, a semiconductor device 2 having a height of 20 to 100 μm, provided with an exposed electrode pad on its upper surface, is die bonded to the cured first insulating layer 7 with a die bonding agent 10.

The die bonding agent 10 may be any known adhesive. When the thickness of the semiconductor device 2 ranges from 20 to 100 μm, a thin semiconductor apparatus can be manufactured.

Then, in the step (5), photo-curable dry films including a photo-curable resin layer, which has a thickness of 5 to 100 μm and is composed of a resist composition, sandwiched between a supporting film and a protective film are prepared.

The photo-curable dry film used in the present invention and a method for producing the same will be now described in detail.

In the inventive method for manufacturing a semiconductor apparatus, the photo-curable dry film used for forming the second insulating layer includes a photo-curable resin layer sandwiched between a supporting film and a protective film. This photo-curable resin layer has a thickness of 5 to 100 μm and is composed of a resist composition.

In the inventive method for manufacturing a semiconductor apparatus, the photo-curable resin layer of the photo-curable dry film used for forming the second insulating layer has a thickness of 5 to 100 μm. This thickness allows a thin semiconductor apparatus to be manufactured.

When the photo-curable dry film is likewise used to form the first insulating layer and the third insulating layer, a film that includes a photo-curable resin layer having a prescribed thickness may be prepared and used.

In the photo-curable dry film used in the present invention, the resist composition constituting the photo-curable resin layer can be prepared by stirring and mixing components of the photo-curable composition and then filtering the mixture through a filter or the like.

The resist composition is preferably a chemically amplified negative resist composition containing the components (A) to (D) mentioned above.

Of course, any other photo-curable resin may be used.

The supporting film of the photo-curable dry film used in the present invention may be a monolayer or a multilayer film having multiple polymer films that are laminated. The dry film is sandwiched between the supporting film and the protective film.

The material of the supporting film may be a synthetic resin film such as polyethylene, polypropylene, polycarbonate, and polyethylene terephthalate. Among them, polyethylene terephthalate, which has appropriate flexibility, mechanical strength, and heat resistance, is preferable. These films may be subjected to various treatments such as corona treatment and coating treatment with a releasing agent. The film may be a commercially available product. Examples thereof include Cerapeel WZ (RX), Cerapeel BX8 (R) (both are available from Toray Advanced Film Co., Ltd.), E7302, E7304 (both are available from Toyobo Co., Ltd.), Purex G31, Purex G71T1 (both are available from Teijin DuPont Films Japan Ltd.), PET38×1-A3, PET38×1-V8, and PET38×1-X08 (all available from Nippa Co., Ltd.).

The protective film of the photo-curable dry film used in the present invention may be the same film as the supporting film mentioned above, and polyethylene terephthalate and polyethylene, which have appropriate flexibility, are preferable. The film may be a commercially available product, and examples thereof include, besides the polyethylene terephthalates already exemplified, polyethylene such as GF-8 (available from Tamapoly Co., Ltd.) and PE Film 0-Type (available from Nippa Co., Ltd.).

The thicknesses of the supporting film and the protective film are preferably 5 to 100 μm each, in view of stable production of the photo-curable dry film and prevention of the rolling habit around a roll axis, so-called curl.

The method for producing the photo-curable dry film used in the present invention will be now described. As to an apparatus for producing the photo-curable dry film, a film coater for producing an adhesive product may be generally used. Illustrative examples of the film coater include a comma coater, a comma reverse coater, a multi coater, a die coater, a lip coater, a lip reverse coater, a direct gravure coater, an offset gravure coater, a 3-roll bottom reverse coater, and a 4-roll bottom reverse coater.

The dry film can be produced as follows. A supporting film is rolled-out from a roll-out axis of a film coater, and the resist composition is applied onto the supporting film with a prescribed thickness to form a photo-curable resin layer while the film passes through a coater head of the film coater. This film then passes through a hot-air circulating oven at a prescribed temperature for a prescribed period. The supporting film with the photo-curable resin layer thus dried thereon passes through a laminate roll together with a protective film rolled-out from another roll-out axis of the film coater under a prescribed pressure to bond the protective film to the photo-curable resin layer on the supporting film, and then is rolled-up by a roll-up axis of the film coater. In this operation, the temperature of the hot-air circulating oven preferably ranges from 25 to 150° C., the period for passing through preferably ranges from 1 to 100 minutes, and the laminate roll pressure preferably ranges from 0.01 to 5 MPa.

The photo-curable dry film can be produced by the above method. Use of such a photo-curable dry film allows the semiconductor device placed on the first insulating layer on the supporting substrate to be excellently embedded and reduces stress caused when the supporting substrate is removed after producing the semiconductor apparatus or when the semiconductor apparatus is diced into individual pieces. Thus, an intended semiconductor apparatus is prevented from warping, and the semiconductor apparatus can be suitably stacked and placed on a circuit board.

Then, in the step (6), the protective film is removed from the photo-curable dry film prepared above, and as shown in FIG. 8(a), a second insulating layer 8 is formed by laminating the photo-curable resin layer of the photo-curable dry film such that the semiconductor device 2 die-bonded on the first insulating layer 7 is covered with the photo-curable resin layer.

An apparatus for bonding the photo-curable dry film is preferably a vacuum laminator. The photo-curable dry film is attached to the apparatus, the protective film is removed from the photo-curable dry film, and the photo-curable resin layer thereby exposed is bonded to the substrate on a table at a prescribed temperature by an adhering roll under a prescribed pressure in a vacuum chamber with a prescribed degree of vacuum. The temperature is preferably 60 to 120° C. The pressure is preferably 0 to 5.0 MPa. The degree of vacuum is preferably 50 to 500 Pa. Such vacuum lamination prevents voids from occurring on the periphery of the semiconductor device, and thus is preferable.

Figure 8:
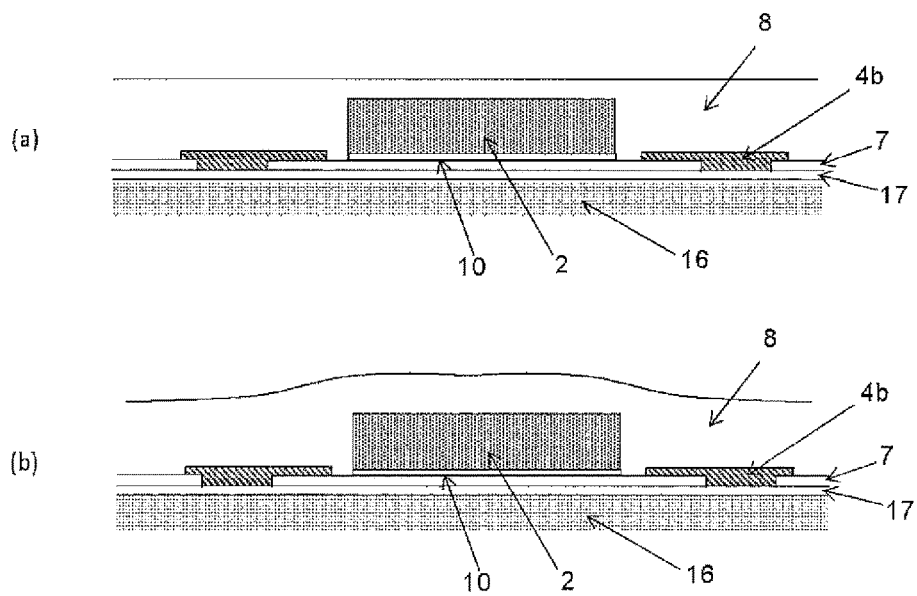
FIG. 8 is a schematic sectional view showing the step (6) in a method for manufacturing a semiconductor apparatus according to an embodiment of the present invention.

When the second insulating layer 8 is formed on the semiconductor device 2 by laminating the photo-curable dry film, the second insulating layer 8 on the semiconductor device 2 can be thick, or the portion farther from the semiconductor device 2 can be thinner, as shown in FIG. 8(b). Thus, the method preferably includes mechanically pressing the film to flatten this variation in thickness and thin the film on the semiconductor device, as shown in FIG. 8 (a).

Figure 9:
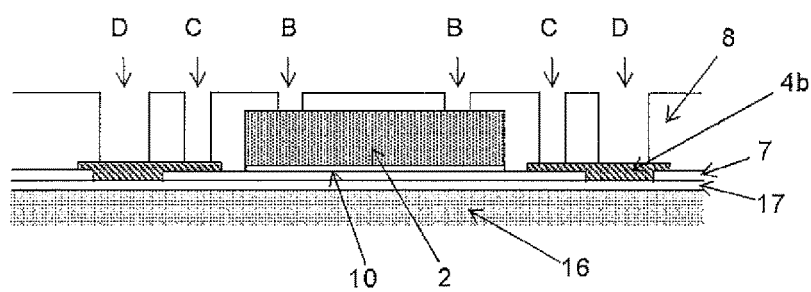
FIG. 9 is a schematic sectional view showing the step (7) in a method for manufacturing a semiconductor apparatus according to an embodiment of the present invention.

Then, in the step (7), as shown in FIG. 9, the second insulating layer 8 is patterned by lithography via a mask to simultaneously form an opening B on the electrode pad, an opening C for forming a metal interconnect (a through metal interconnect) that penetrates the second insulating layer on the metal interconnect (the lower metal interconnect) 4b to be connected to the through electrode, and an opening D for forming the through electrode, and then the second insulating layer 8 is cured by baking.

In this patterning, after the second insulating layer 8 is formed, the layer is exposed to light, subjected to post exposure baking (PEP), developed, and optionally post-cured to form a pattern. In other words, a known lithography technique can be used for patterning as in patterning of the first insulating layer.

In the inventive method for manufacturing a semiconductor apparatus, the opening B on the electrode pad, the opening C for forming the through metal interconnect, and the opening D for forming the through electrode are simultaneously formed by one-shot exposure. Thus, it is rational.

Figure 10:
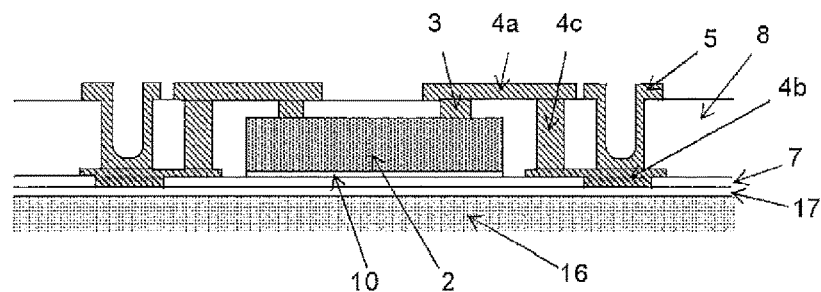
FIG. 10 is a schematic sectional view showing the step (8) in a method for manufacturing a semiconductor apparatus according to an embodiment of the present invention.

Then, in the step (8), as shown in FIG. 10, after the second insulating layer 8 is cured, a seed layer is formed by sputtering. Then, the opening B on the electrode pad, the opening C for forming the metal interconnect (the through metal interconnect) that penetrates the second insulating layer, and the opening D for forming the through electrode are filled by plating to respectively form an on-semiconductor-device metal pad 3, the metal interconnect (the through metal interconnect) 4c that penetrates the second insulating layer, and the through electrode 5. The on-semiconductor-device metal pad 3 and the metal interconnect (the through metal interconnect) 4c that penetrates the second insulating layer, which are formed by plating, are connected via a metal interconnect (an upper metal interconnect) 4a formed by plating.

The plating is performed as in the step (3). For example, a seed layer is formed by sputtering, and the plating resist is patterned. Then, electrolytic plating or the like is performed to form the on-semiconductor-device metal pad 3, the through metal interconnect 4c, the through electrode 5, and the upper metal interconnect 4a that connects the on-semiconductor-device metal pad 3 and the through metal interconnect 4c.

The upper metal interconnect 4a is appropriately adjusted so as to have a desired interconnect width. In particular, the upper metal interconnect is preferably formed with a thickness of 0.1 to 10 μm on the second insulating layer.

Figure 11:
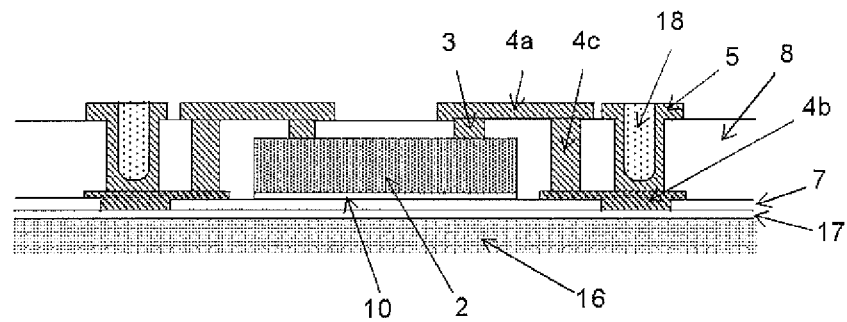
FIG. 11 is a schematic sectional view showing the step (8) in a method for manufacturing a semiconductor apparatus according to an embodiment of the present invention.

The through electrode 5 may be further plated by additional electrolytic plating to add plating of the through electrode 5 and fill the through electrode 5 with a metal plating 18, as shown in FIG. 11.

Additionally, the through metal interconnect 4c may be further plated by additional electrolytic plating to add plating of the through metal interconnect 4c.

Figure 12:
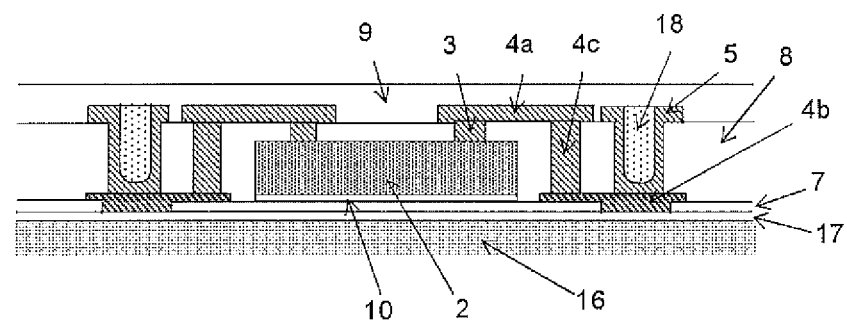
FIG. 12 is a schematic sectional view showing the step (9) in a method for manufacturing a semiconductor apparatus according to an embodiment of the present invention.

Then, in the step (9), after the metal interconnects are formed, a third insulating layer 9 is formed by laminating the photo-curable resin layer of the photo-curable dry film or applying the resist composition used in the photo-curable dry film by spin coating, as shown in FIG. 12.

The third insulating layer 9 may be formed by, for example, laminating a photo-curable dry film having a photo-curable resin layer composed of a chemically amplified negative resist composition containing the components (A) to (D), or applying the resist composition by spin coating, in the same manner as the first insulating layer is formed. Of course, other photo-curable resin may be used The third insulating layer preferably has a thickness of 5 to 100 μm. This thickness allows a thin semiconductor apparatus to be manufactured.

Figure 13:
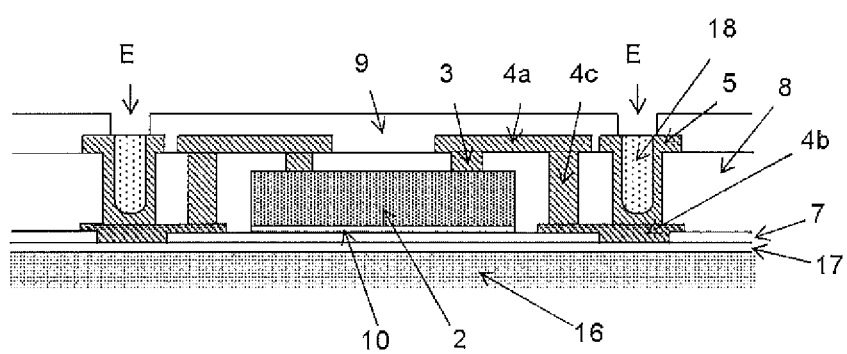
FIG. 13 is a schematic sectional view showing the step (10) in a method for manufacturing a semiconductor apparatus according to an embodiment of the present invention.

Then, in the step (10), as shown in FIG. 13, the third insulating layer 9 is patterned by lithography via a mask to form an opening E on the through electrode 5, and then the third insulating layer 9 is cured by baking.

In this patterning, after the third insulating layer 9 is formed, the layer is exposed to light, subjected to post exposure baking (PEB), developed, and optionally post-cured to form a pattern. In other words, a known lithography technique can be used for patterning as in patterning of the first insulating layer.

Then, in the step (11), a solder bump is formed in the opening E on the through electrode after the third insulating layer is cured.

Figure 14:
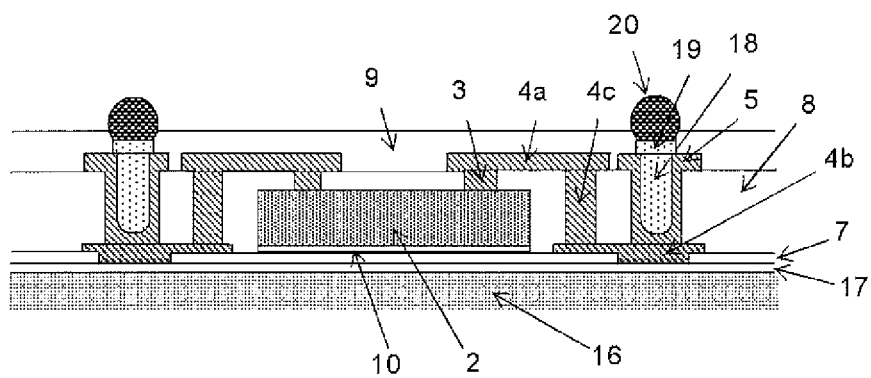
FIG. 14 is a schematic sectional view showing the step (11) in a method for manufacturing a semiconductor apparatus according to an embodiment of the present invention.

The solder bump may be formed by, for example, plating the opening E on the through electrode to form an on-through-electrode metal pad 19, and then forming a solder ball 20 on the on-through-electrode metal pad 19 as the solder bump, as shown in FIG. 14.

Figure 15:
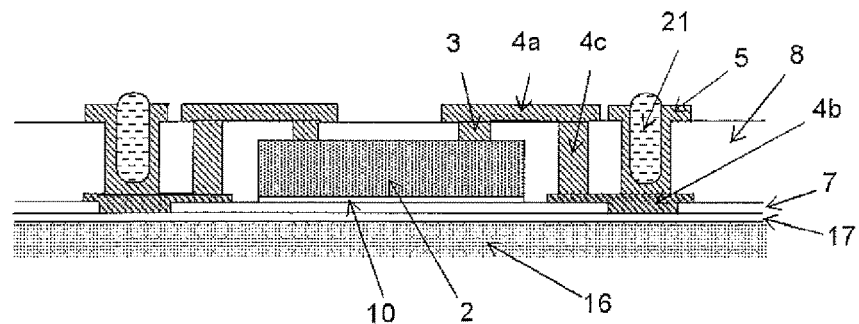
FIG. 15 is a schematic sectional view showing the step (8) in a method for manufacturing a semiconductor apparatus according to another embodiment of the present invention.
Figure 16:
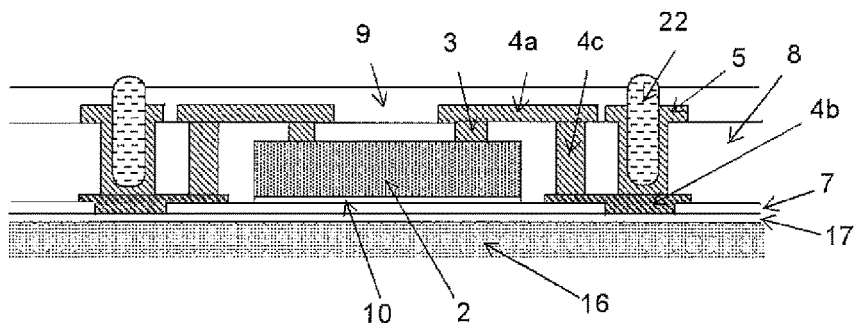
FIG. 16 is a schematic sectional view showing the step (11) in a method for manufacturing a semiconductor apparatus according to another embodiment of the present invention.

Alternatively, the solder bump may be formed as follows. In the step (8), the through electrode 5 is further plated with SnAg to add plating and form an SnAg plating 21, as shown in FIG. 15. In the subsequent step (9), the third insulating layer 9 is formed as mentioned above. In the step (10), the third insulating layer is patterned to form the opening E on the through electrode such that the SnAg plating 21 is uncovered, and then cured by baking. In the step (11), the SnAg plating 21 is melted and brought to protrude toward the opening E on the through electrode so as to form a protruding SnAg electrode 22 as the solder bump, as shown in FIG. 16.

Figure 17:
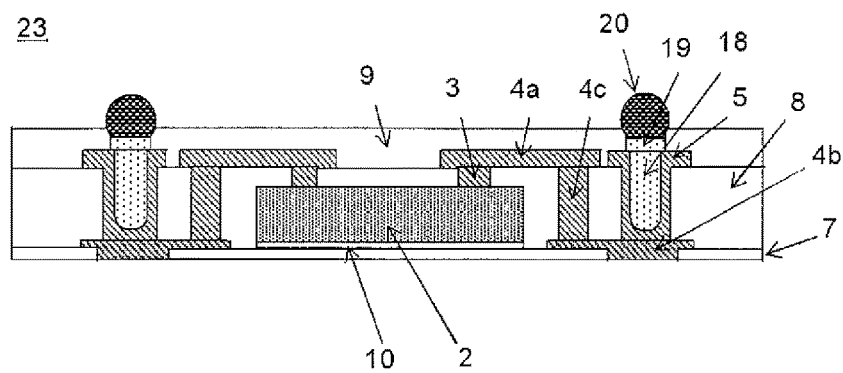
FIG. 17 is a schematic sectional view showing an individual semiconductor apparatus obtained by a method for manufacturing a semiconductor apparatus according to an embodiment of the present invention.

Moreover, after the step (11), the supporting substrate 16, which has been temporarily bonded to the first insulating layer 7 in the step (1), may be removed to uncover a side of the through electrode 5 (the lower metal interconnect 4b) opposite to the solder ball 20, and the uncovered seed layer may be removed by etching to expose the metal plating portion, as shown in FIG. 17. This allows the upper portion and the lower portion of the through electrode 5 to electrically continue. Thereafter, the semiconductor apparatus may be diced into individual pieces, whereby individual semiconductor apparatus 23 can be obtained.

Figure 18:
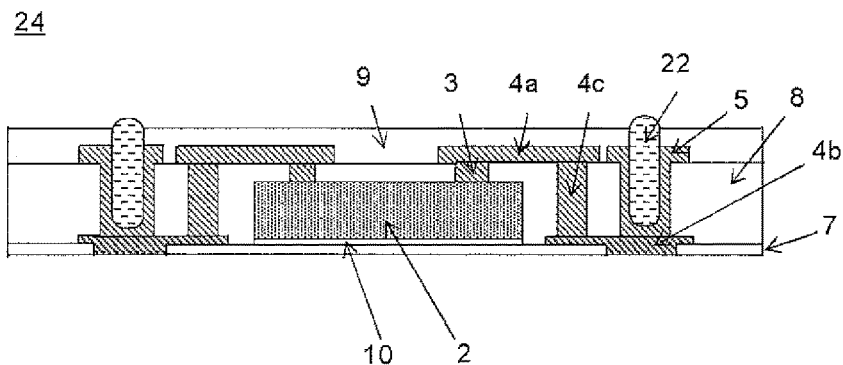
FIG. 18 is a schematic sectional view showing an individual semiconductor apparatus obtained by a method for manufacturing a semiconductor apparatus according to another embodiment of the present invention.

In the case that the protruding SnAg electrode 22 is formed as the solder bump, the supporting substrate 16 may be likewise removed to uncover a side of the through electrode 5 (the lower metal interconnect 4b) opposite to the protruding SnAg electrode 22, and the uncovered seed layer may be removed by etching to expose the metal plating portion, as shown in FIG. 18. This allows the upper portion and the lower portion of the through electrode 5 to electrically continue. Thereafter, the semiconductor apparatus may be diced into individual pieces, whereby individual semiconductor apparatus 24 can be obtained.

The inventive manufacturing method is especially suited for downsizing and thinning and enables production of a thin and compact semiconductor apparatus with a thickness of 50 to 300 μm, more preferably 70 to 150 μm.

Figure 19:
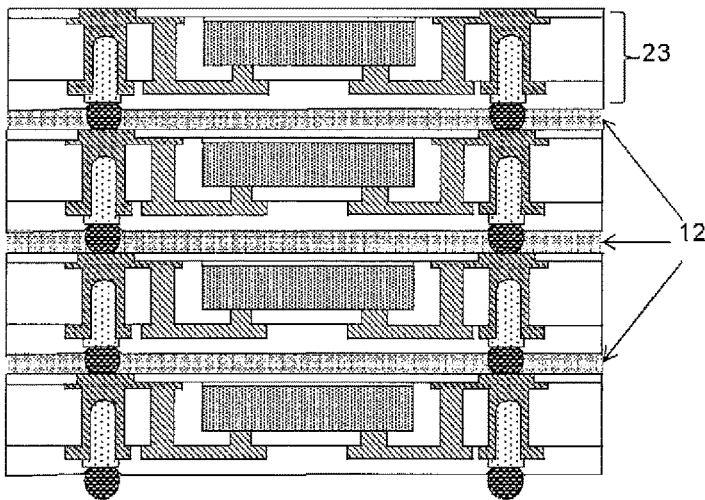
FIG. 19 is a schematic sectional view showing a method for manufacturing a stacked semiconductor apparatus according to an embodiment of the present invention.
Figure 20:
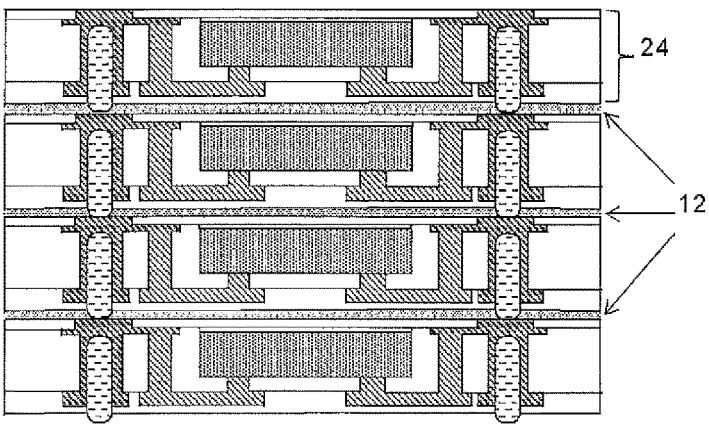
FIG. 20 is a schematic sectional view showing a method for manufacturing a stacked semiconductor apparatus according to another embodiment of the present invention.
Figure 21:
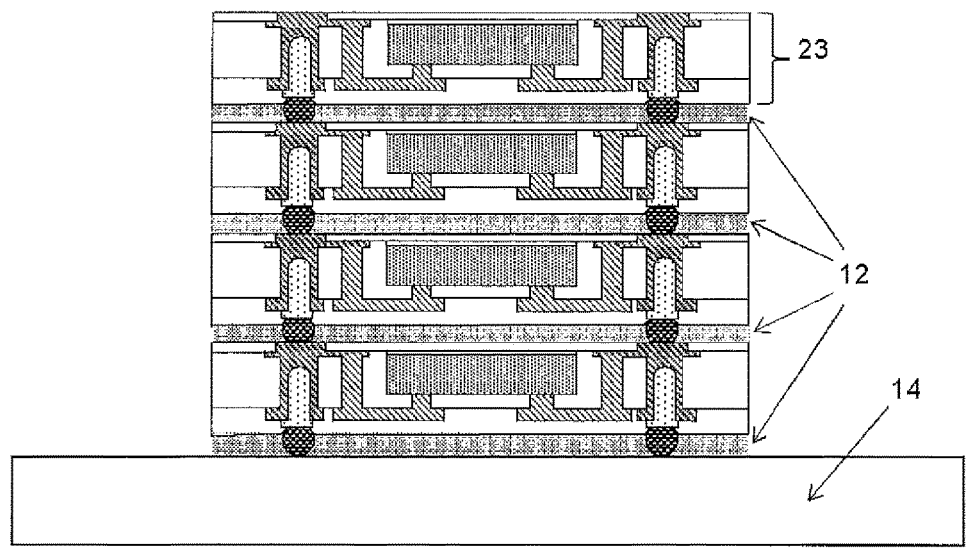
FIG. 21 is a schematic sectional view showing a stacked semiconductor apparatus placed on a circuit board according to an embodiment of the present invention.
Figure 22:
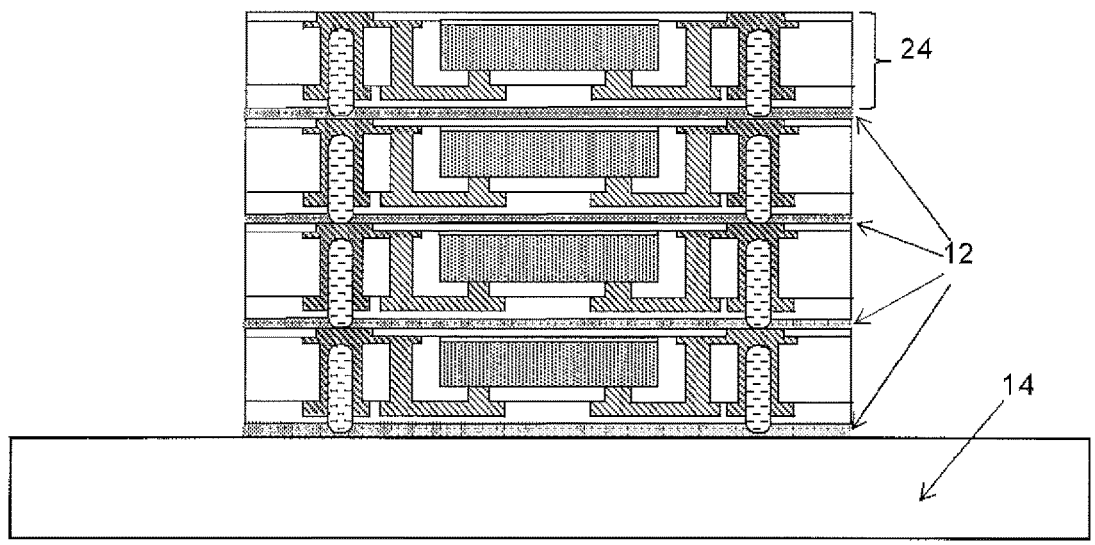
FIG. 22 is a schematic sectional view showing a stacked semiconductor apparatus placed on a circuit board according to another embodiment of the present invention.

The individual semiconductor apparatuses 23 or the individual semiconductor apparatuses 24 can be stacked while inserting insulting resin layers 12 such that the individual semiconductor apparatuses are electrically connected through the solder bump to obtain a stacked semiconductor apparatus, as shown in FIG. 19 and FIG. 20. The stacked semiconductor apparatus can be placed on a substrate (circuit board 14) having an electric circuit, as shown in FIG. 21 and FIG. 22. FIGS. 19, 20, 21, and 22 each show an example in which the individual semiconductor apparatuses 23 or 24 are flip-chip bonded.

Figure 23:
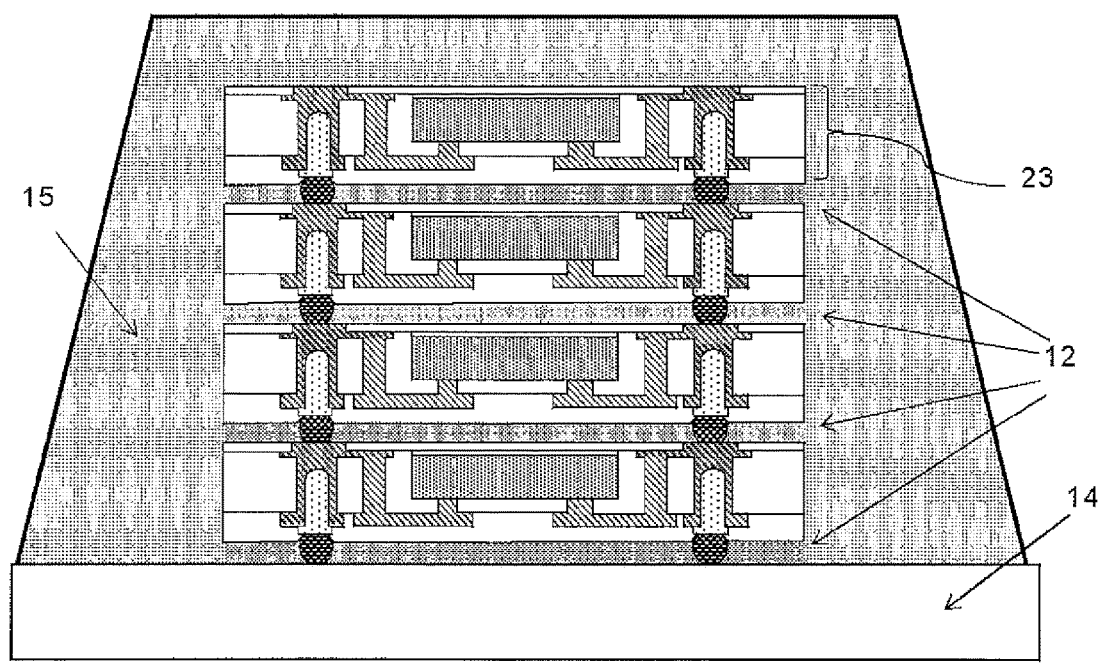
FIG. 23 is a schematic sectional view showing a method for manufacturing an encapsulated stacked-semiconductor apparatus according to an embodiment of the present invention.
Figure 24:
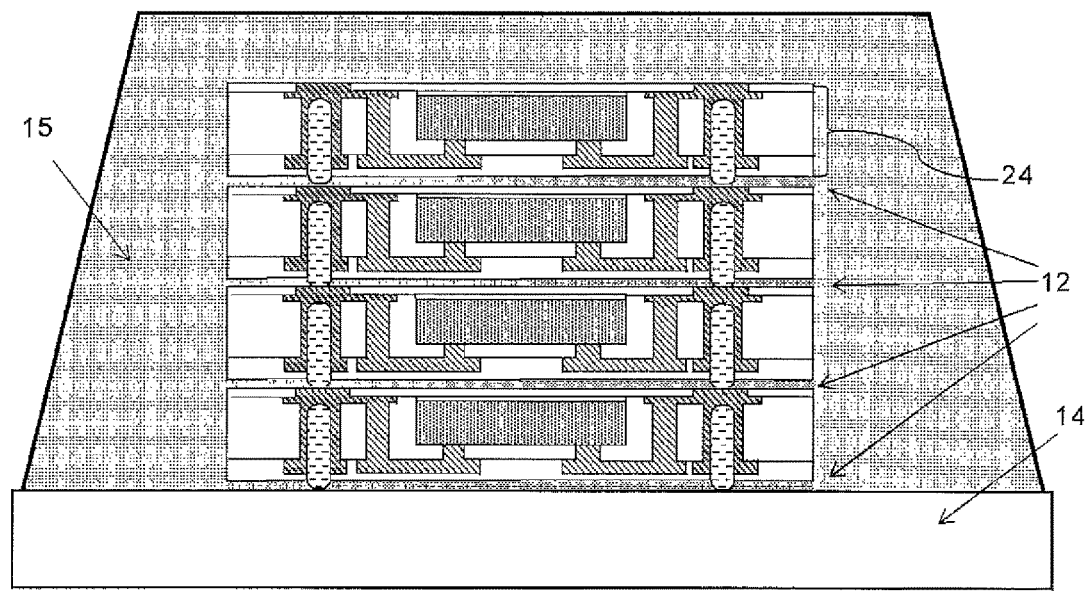
FIG. 24 is a schematic sectional view showing a method for manufacturing an encapsulated stacked-semiconductor apparatus according to another embodiment of the present invention.
Figure 25:
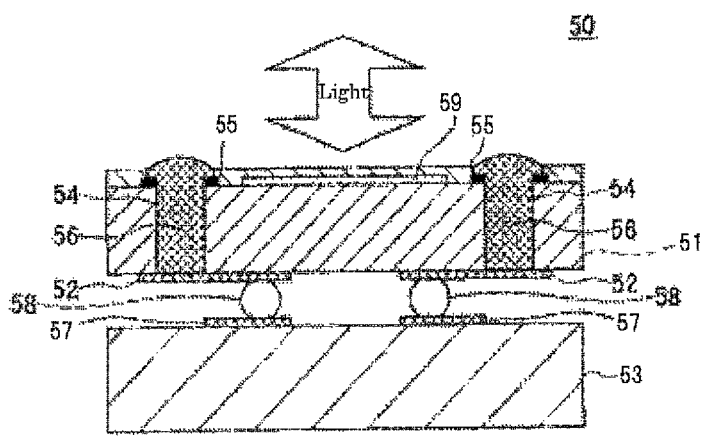
FIG. 25 is an explanatory view showing a conventional method for manufacturing a semiconductor apparatus.
Figure 26:
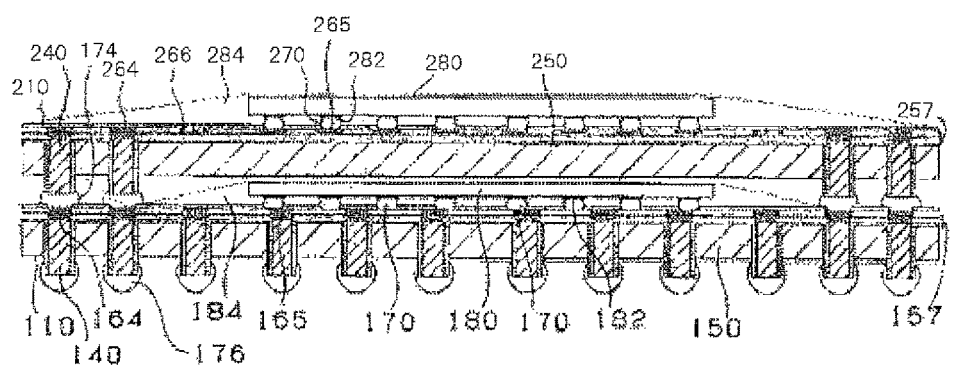
FIG. 26 is an explanatory view showing a conventional method for manufacturing a semiconductor apparatus.
Figure 27:
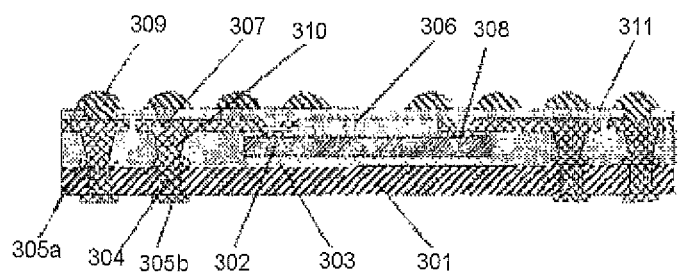
FIG. 27 is an explanatory view showing a conventional method for manufacturing a semiconductor apparatus.
Figure 28:
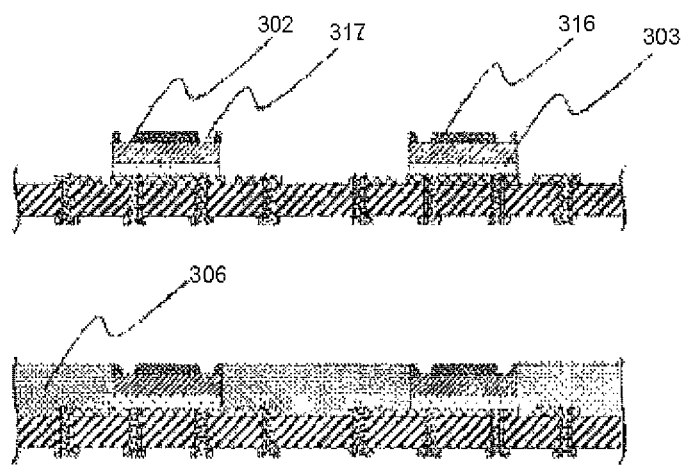
FIG. 28 is an explanatory view showing a conventional method for manufacturing a semiconductor apparatus.

In addition, the stacked semiconductor apparatus thus manufactured can be placed on a circuit board 14 and encapsulated with an insulating encapsulating resin layer 15 to manufacture an encapsulated stacked-semiconductor apparatus, as shown in FIG. 23 and FIG. 24.

A resin used in the insulting resin layer 12 or the insulating encapsulating resin layer 15 may be any materials commonly used for this use. Examples thereof include epoxy resins, silicone resins, and hybrid resins thereof.

The inventive semiconductor apparatus, stacked semiconductor apparatus, and encapsulated stacked-semiconductor apparatus manufactured as described above can be suitably used for fan-out wiring formed in a semiconductor chip and wafer level chip size package (WCSP).

As previously described, the inventive semiconductor apparatus can be easily placed on a circuit board and stacked by forming the fine electrode on the semiconductor device and providing the through electrode outside the semiconductor device. In addition, this semiconductor apparatus allows the semiconductor device to be embedded without voids at the periphery even when the semiconductor device has a height of several tens of μm, and warpage of the semiconductor apparatus can be reduced even with dense metal interconnects.

Moreover, the inventive method for manufacturing a semiconductor apparatus facilitates placing the semiconductor apparatus on a circuit board and stacking the semiconductor apparatuses by forming the fine electrode on the semiconductor device and forming the through electrode outside the semiconductor device. This method also facilitates processing the openings of the electrode pad portion, the through electrode, and the like.

Moreover, the inventive semiconductor apparatus thus obtained can be easily placed on a circuit board and stacked, and thus can be used for a stacked semiconductor apparatus including the semiconductor apparatuses that are stacked and for an encapsulated stacked-semiconductor apparatus including the stacked semiconductor apparatus placed on a circuit board and then encapsulated.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A semiconductor apparatus comprising: a semiconductor device; an on-semiconductor-device metal pad electrically connected to the semiconductor device; a metal interconnect electrically connected to the semiconductor device; a through electrode electrically connected to the metal interconnect; a solder bump electrically connected to the metal interconnect; a first insulating layer on which the semiconductor device is placed; a second insulating layer formed on the semiconductor device; a third insulating layer formed on the second insulating layer, wherein
   the through electrode penetrates at least the second insulating layer,
   the metal interconnect is electrically connected to the semiconductor device via the on-semiconductor-device metal pad at an upper surface of the second insulating layer, and the metal interconnect penetrates the second insulating layer from the upper surface of the second insulating layer and is electrically connected to the through electrode at an lower surface of the second insulating layer,
   the first insulating layer is formed by a photo-curable dry film or a photo-curable resist coating film,
   the second insulating layer is formed by the photo-curable dry film, and
   the third insulating layer is formed by the photo-curable dry film or a photo-curable resist coating film; wherein
      the photo-curable dry film has a photo-curable resin layer composed of a photo-curable resin composition containing: resin, crosslinking agents, a photo acid generator and a solvent, or
      the photo-curable resist coating film is a photo-curable resin layer composed of a photo-curable resin composition containing: resin, crosslinking agents, a photo acid generator and a solvent.

2. The semiconductor apparatus according to claim 1, wherein the semiconductor device has a height of 20 to 100 μm, the first insulating layer has a thickness of 1 to 20 μm, the second insulating layer has a thickness of 5 to 100 μm, the third insulating layer has a thickness of 5 to 100 μm, and the semiconductor apparatus has a thickness of 50 to 300 μm.

3. The semiconductor apparatus according to claim 2, wherein the photo-curable dry film has a photo-curable resin layer composed of a chemically amplified negative resist composition containing:
   (A) a silicone skeleton-containing polymer compound having a repeating unit shown by the following general formula (1) and having a weight average molecular weight of 3,000 to 500,000

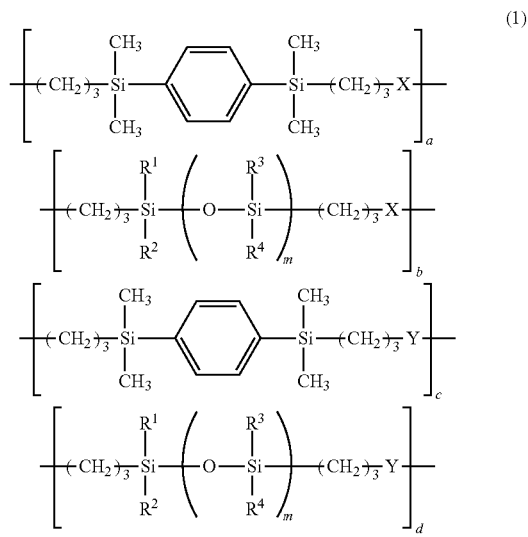

wherein $R^1$ to $R^4$ may be the same or different and represent a monovalent hydrocarbon group having 1 to 8 carbon atoms; "m" is an integer of 1 to 100; "a", "b", "c", and "d" are each 0 or a positive number, and "a", "b", "c", and "d" are not simultaneously 0, provided that a+b+c+d=1; X represents an organic group shown by the following general formula (2); and Y represents an organic group shown by the following general formula (3);

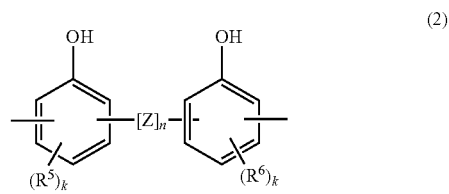

wherein Z represents a divalent organic group selected from any of

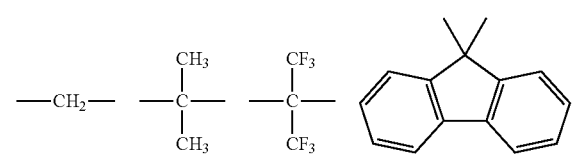

"n" is 0 or 1; $R^5$ and $R^6$ each represent an alkyl group or alkoxy group having 1 to 4 carbon atoms and may be the same or different from each other; and "k" is 0, 1, or 2;

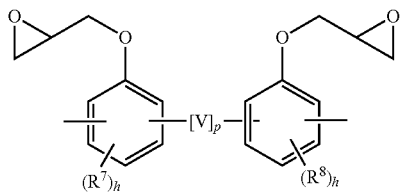
(3)

wherein V represents a divalent organic group selected from any of

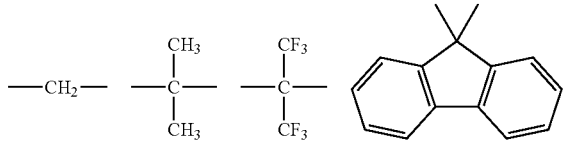

"p" is 0 or 1; $R^7$ and $R^8$ each represent an alkyl group or alkoxy group having 1 to 4 carbon atoms and may be the same or different from each other; and "h" is 0, 1, or 2;

(B) one or more crosslinking agents selected from an amino condensate modified with formaldehyde or formaldehyde-alcohol and a phenol compound having on average two or more methylol groups or alkoxymethylol groups per molecule;

(C) a photo acid generator capable of generating an acid by decomposition with light having a wavelength of 190 to 500 nm; and (D) a solvent.

4. The semiconductor apparatus according to claim 1, wherein the photo-curable dry film has a photo-curable resin layer composed of a chemically amplified negative resist composition containing:

(A) a silicone skeleton-containing polymer compound having a repeating unit shown by the following general formula (1) and having a weight average molecular weight of 3,000 to 500,000

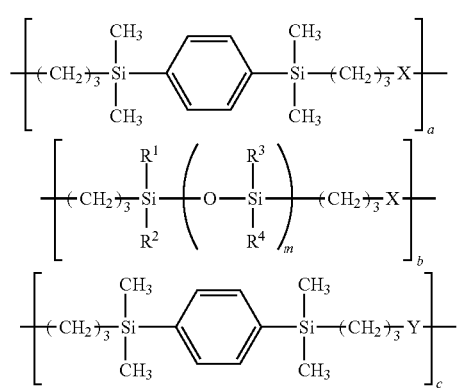
(1)

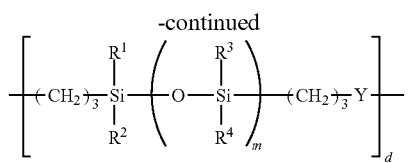

wherein $R^1$ to $R^4$ may be the same or different and represent a monovalent hydrocarbon group having 1 to 8 carbon atoms; "m" is an integer of 1 to 100; "a", "b", "c", and "d" are each 0 or a positive number, and "a", "b", "c", and "d" are not simultaneously 0, provided that a+b+c+d=1; X represents an organic group shown by the following general formula (2); and Y represents an organic group shown by the following general formula (3);

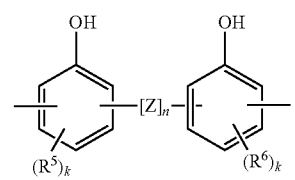
(2)

wherein Z represents a divalent organic group selected from any of

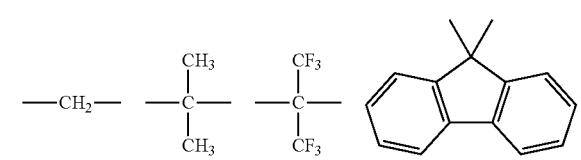

"n" is 0 or 1; $R^5$ and $R^6$ each represent an alkyl group or alkoxy group having 1 to 4 carbon atoms and may be the same or different from each other; and "k" is 0, 1, or 2;

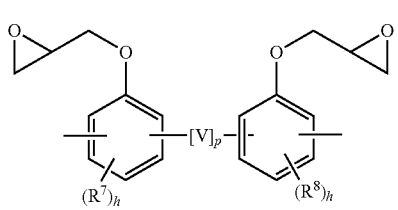
(3)

wherein V represents a divalent organic group selected from any of

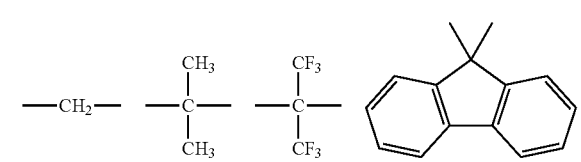

"p" is 0 or 1; $R^7$ and $R^8$ each represent an alkyl group or alkoxy group having 1 to 4 carbon atoms and may be the same or different from each other; and "h" is 0, 1, or 2;

(B) one or more crosslinking agents selected from an amino condensate modified with formaldehyde or formaldehyde-alcohol and a phenol compound having on average two or more methylol groups or alkoxymethylol groups per molecule;

(C) a photo acid generator capable of generating an acid by decomposition with light having a wavelength of 190 to 500 nm; and (D) a solvent.

5. The semiconductor apparatus according to claim 1, wherein the photo-curable resin composition is a chemically amplified negative resist composition.

6. A stacked semiconductor apparatus, comprising a plurality of semiconductor apparatuses stacked by flip chip, wherein each semiconductor apparatus of the plurality of semiconductor apparatuses comprises:

a semiconductor device; an on-semiconductor-device metal pad electrically connected to the semiconductor device; a metal interconnect electrically connected to the semiconductor device; a through electrode electrically connected to the metal interconnect; a solder bump electrically connected to the metal interconnect; a first insulating layer on which the semiconductor device is placed; a second insulating layer formed on the semiconductor device; a third insulating layer formed on the second insulating layer, wherein the through electrode penetrates at least the second insulating layer, the metal interconnect is electrically connected to the semiconductor device via the on-semiconductor-device metal pad at an upper surface of the second insulating layer, and the metal interconnect penetrates the second insulating layer from the upper surface of the second insulating layer and is electrically connected to the through electrode at an lower surface of the second insulating layer, the first insulating layer is formed by a photo-curable dry film or a photo-curable resist coating film, the second insulating layer is formed by the photo-curable dry film, and the third insulating layer is formed by the photo-curable dry film or a photo-curable resist coating film; wherein the photo-curable dry film has a photo-curable resin layer composed of a photo-curable resin composition containing: resin, crosslinking agents, a photo acid generator and a solvent, or the photo-curable resist coating film is a photo-curable resin layer composed of a photo-curable resin composition containing: resin, crosslinking agents, a photo acid generator and a solvent.

7. An encapsulated stacked-semiconductor apparatus, comprising a stacked semiconductor apparatus placed on a substrate having an electric circuit, the stacked semiconductor apparatus being encapsulated with an insulating encapsulating resin layer, wherein the stacked semiconductor apparatus comprises a plurality of semiconductor apparatuses stacked by flip chip, where each semiconductor apparatus of the plurality of semiconductor apparatuses comprises:

a semiconductor device; an on-semiconductor-device metal pad electrically connected to the semiconductor device; a metal interconnect electrically connected to the semiconductor device; a through electrode electrically connected to the metal interconnect; a solder bump electrically connected to the metal interconnect; a first insulating layer on which the semiconductor device is placed; a second insulating layer formed on the semiconductor device; a third insulating layer formed on the second insulating layer, wherein the through electrode penetrates at least the second insulating layer, the metal interconnect is electrically connected to the semiconductor device via the on-semiconductor-device metal pad at an upper surface of the second insulating layer, and the metal interconnect penetrates the second insulating layer from the upper surface of the second insulating layer and is electrically connected to the through electrode at an lower surface of the second insulating layer, the first insulating layer is formed by a photo-curable dry film or a photo-curable resist coating film, the second insulating layer is formed by the photo-curable dry film, and the third insulating layer is formed by the photo-curable dry film or a photo-curable resist coating film; wherein the photo-curable dry film has a photo-curable resin layer composed of a photo-curable resin composition containing: resin, crosslinking agents, a photo acid generator and a solvent, or the photo-curable resist coating film is a photo-curable resin layer composed of a photo-curable resin composition containing: resin, crosslinking agents, a photo acid generator and a solvent.

* * * * *